US012660105B2

(12) United States Patent
Pyo et al.

(10) Patent No.: US 12,660,105 B2
(45) Date of Patent: Jun. 16, 2026

(54) DISPLAY DEVICE

(71) Applicant: LG ELECTRONICS INC., Seoul (KR)

(72) Inventors: Jonggil Pyo, Seoul (KR); Hanseok Hwangbo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 83 days.

(21) Appl. No.: 18/728,265

(22) PCT Filed: Jan. 12, 2022

(86) PCT No.: PCT/KR2022/000562
§ 371 (c)(1),
(2) Date: Jul. 11, 2024

(87) PCT Pub. No.: WO2023/136370
PCT Pub. Date: Jul. 20, 2023

(65) Prior Publication Data
US 2025/0107018 A1      Mar. 27, 2025

(51) Int. Cl.
*H05K 5/02* (2006.01)
*G06F 1/16* (2006.01)
(52) U.S. Cl.
CPC ......... *H05K 5/0217* (2013.01); *G06F 1/1652* (2013.01)
(58) Field of Classification Search
CPC ......... H05K 5/0217; G09F 9/301; G06F 1/16; G06F 1/1652
See application file for complete search history.

(56) References Cited

U.S. PATENT DOCUMENTS

| | | | | |
|---|---|---|---|---|
| 9,116,662 | B1* | 8/2015 | Song ...................... | G06F 1/1601 |
| 9,123,290 | B1* | 9/2015 | Cho ...................... | G06F 1/1652 |
| 9,645,605 | B2* | 5/2017 | Park ...................... | G06F 1/1605 |
| 10,767,808 | B2* | 9/2020 | Li ........................... | F16M 11/18 |
| 2014/0376163 | A1* | 12/2014 | Song ...................... | G09F 9/301 |
| | | | | 361/679.01 |
| 2015/0185761 | A1* | 7/2015 | Song ........................ | H04N 5/64 |
| | | | | 361/679.21 |

(Continued)

FOREIGN PATENT DOCUMENTS

| | | |
|---|---|---|
| KR | 10-2015-0122511 A | 11/2015 |
| KR | 10-1671698 B1 | 11/2016 |

(Continued)

*Primary Examiner* — Sagar Shrestha
(74) *Attorney, Agent, or Firm* — Birch, Stewart, Kolasch & Birch, LLP

(57) ABSTRACT

A display device is provided. The display device of the present disclosure may include: a flexible display panel; a flexible plate which is positioned behind the display panel and to which the display panel is coupled; a driving module positioned behind the plate and coupled to the plate, the driving module including a slider that performs a linear reciprocating motion and a motor providing power to the slider; a wing positioned behind the plate and having one end coupled to the slider and the other end coupled to the plate, the wing including a pivot shaft disposed adjacent to the one end; a sensor detecting at least one of rotation of the motor or a position of the slider; and a controller controlling operation of the motor based on information obtained from the sensor.

14 Claims, 31 Drawing Sheets

(56)                    References Cited

U.S. PATENT DOCUMENTS

| | | | |
|---|---|---|---|
| 2015/0296641 A1* | 10/2015 | Song | F16M 11/18 |
| | | | 361/679.01 |
| 2016/0127674 A1* | 5/2016 | Kim | H04N 21/42204 |
| | | | 348/739 |
| 2017/0193863 A1* | 7/2017 | Cho | G06F 1/16 |
| 2017/0347466 A1* | 11/2017 | Kang | G09G 3/20 |
| 2018/0226001 A1* | 8/2018 | Chen | G09F 15/0031 |
| 2020/0323087 A1* | 10/2020 | Hwang | G06F 1/1652 |
| 2021/0141587 A1* | 5/2021 | Cho | H04R 5/02 |
| 2022/0019271 A1* | 1/2022 | Kim | G06F 1/1605 |

FOREIGN PATENT DOCUMENTS

| | | |
|---|---|---|
| KR | 10-2016-0145907 A | 12/2016 |
| KR | 10-2021-0056094 A | 5/2021 |
| KR | 10-2312518 B1 | 10/2021 |

* cited by examiner

[FIG. 1]
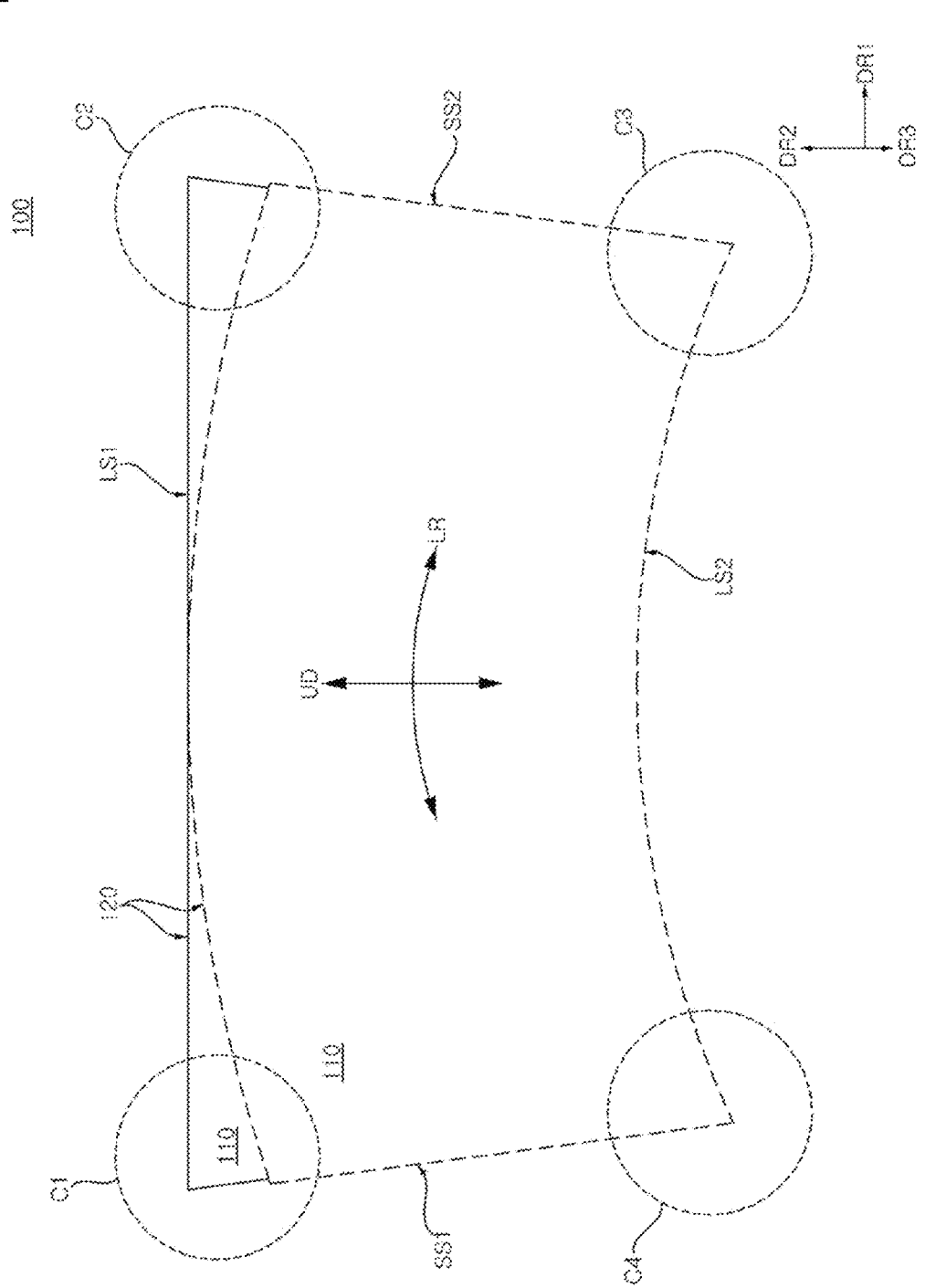

[FIG. 2]
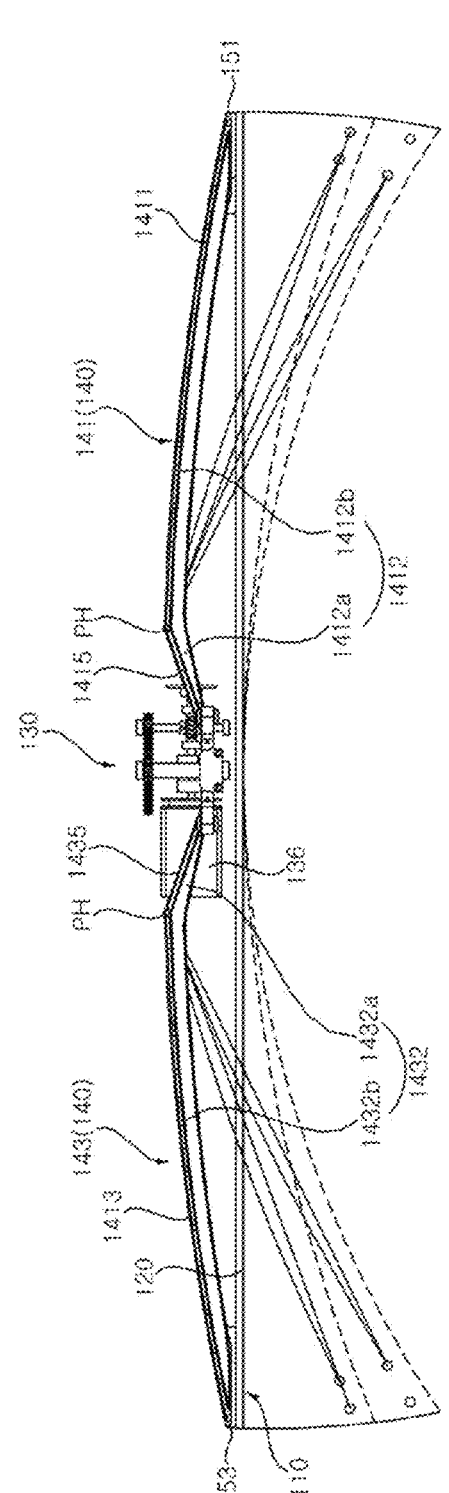

[FIG. 3]
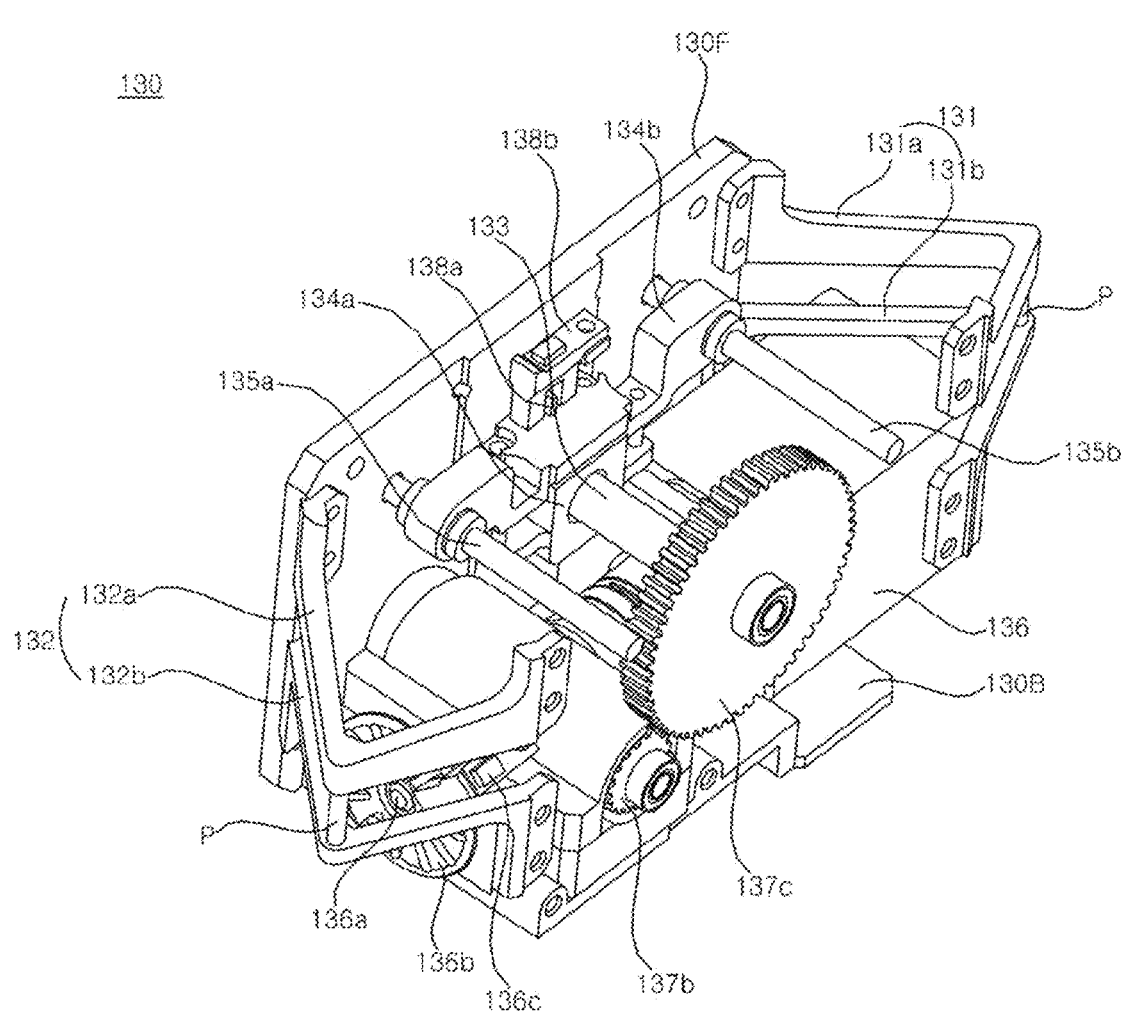

[FIG. 4]
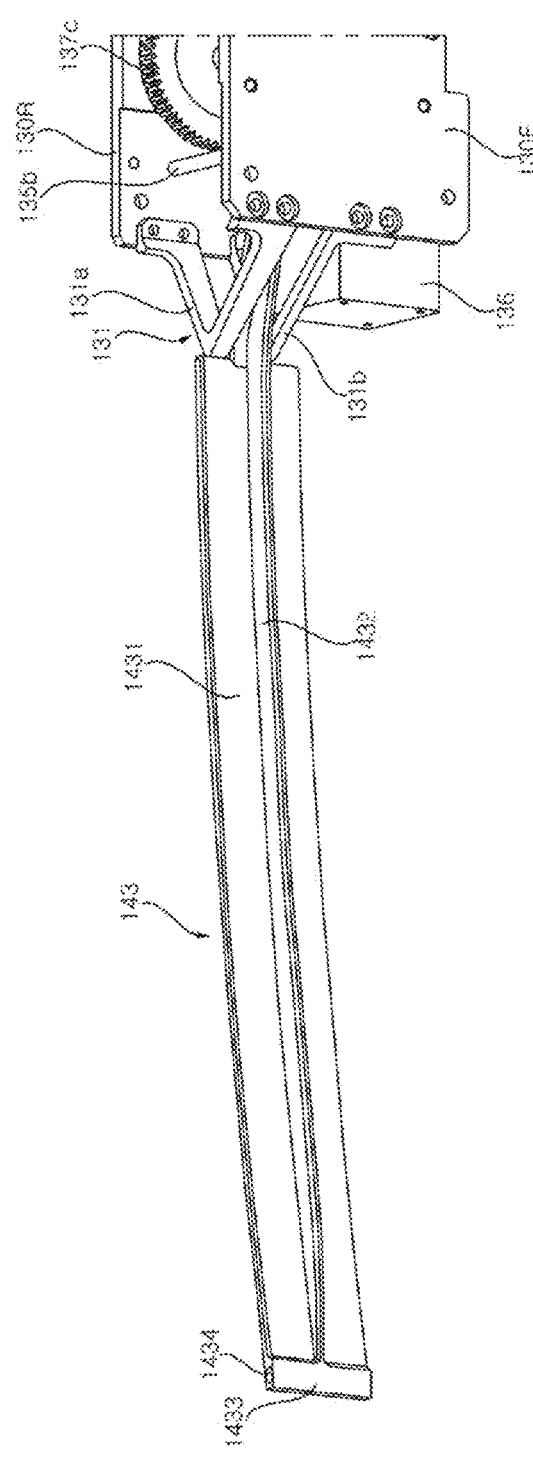

[FIG. 5]
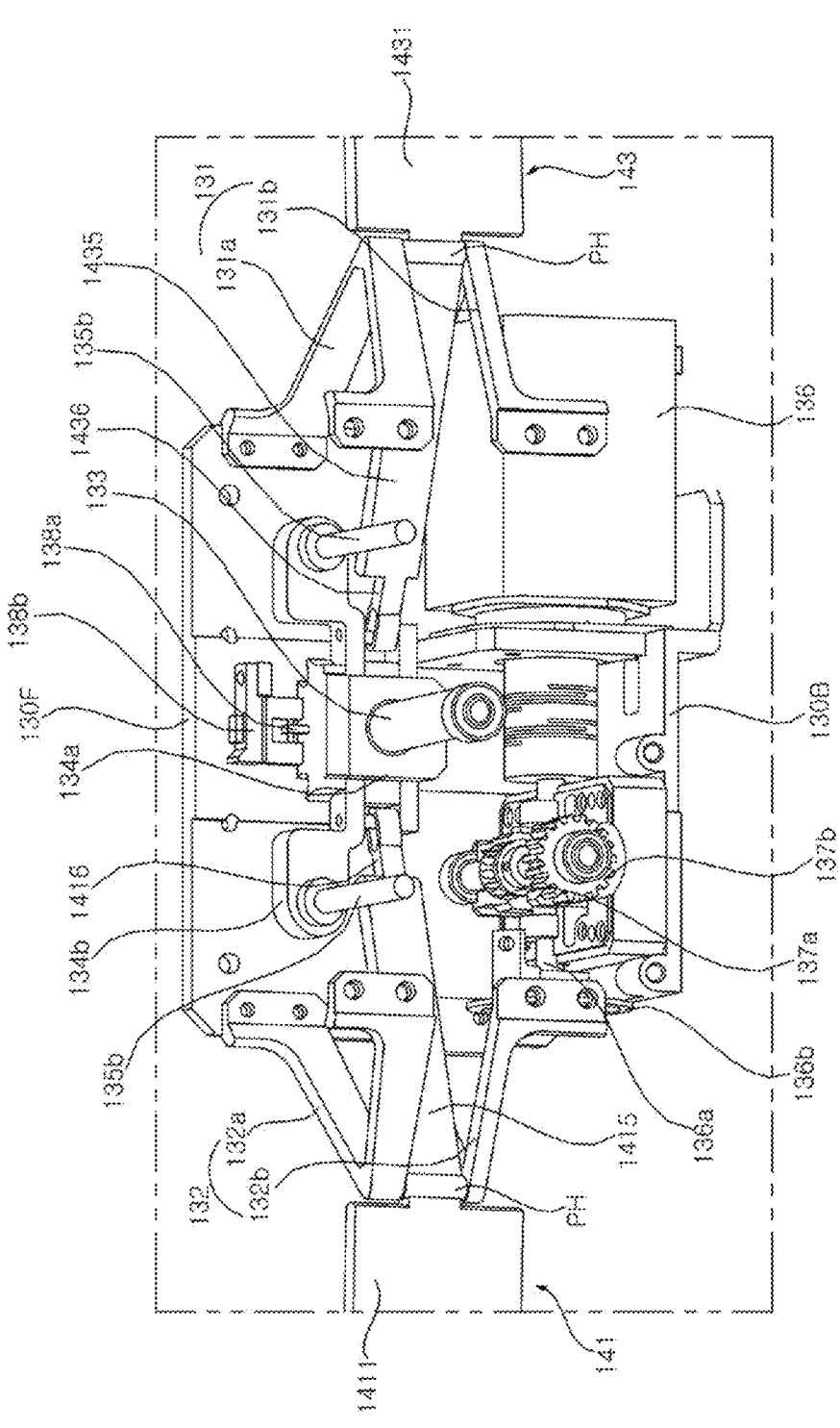

[FIG. 6]
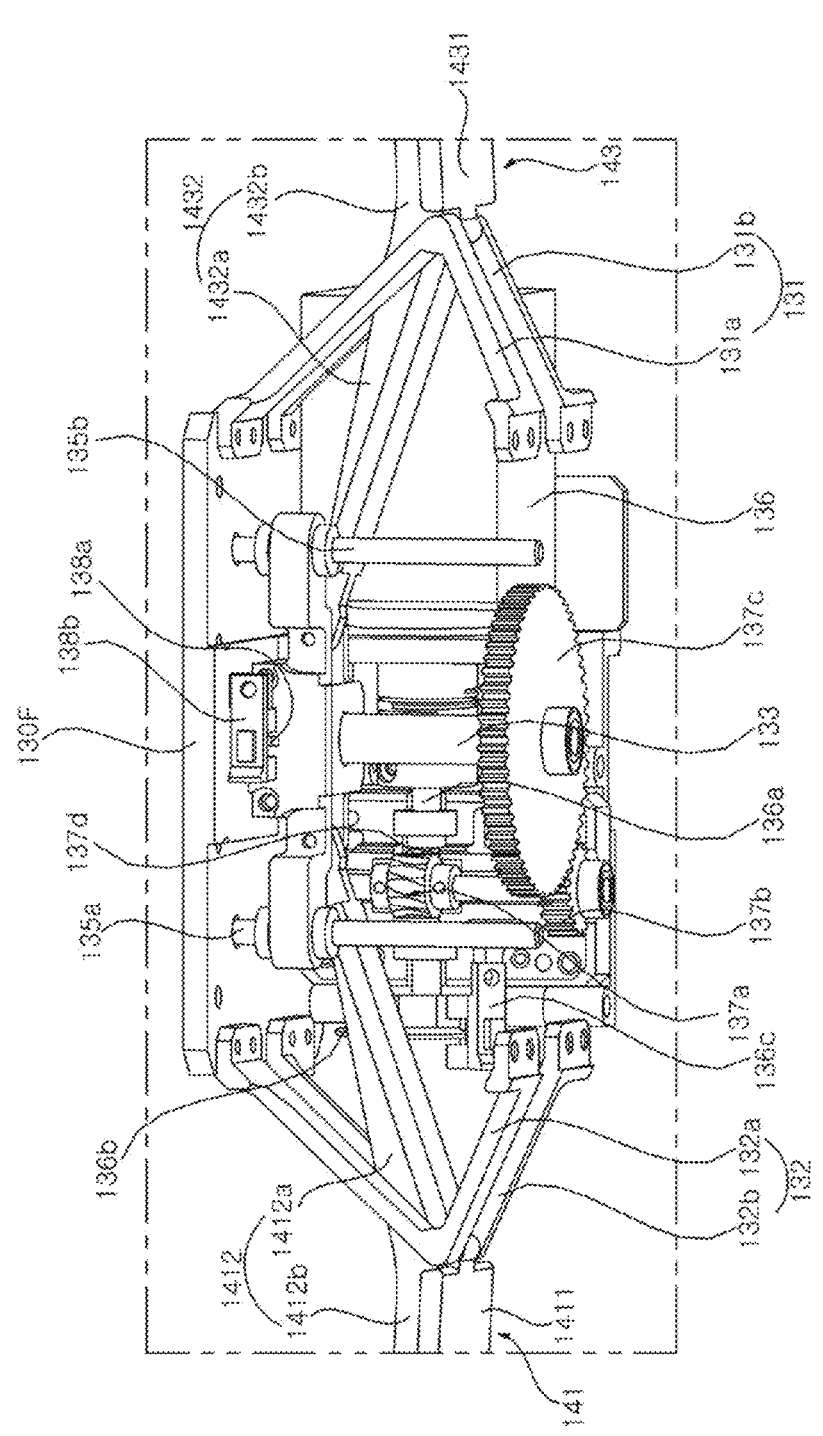

[FIG. 7]
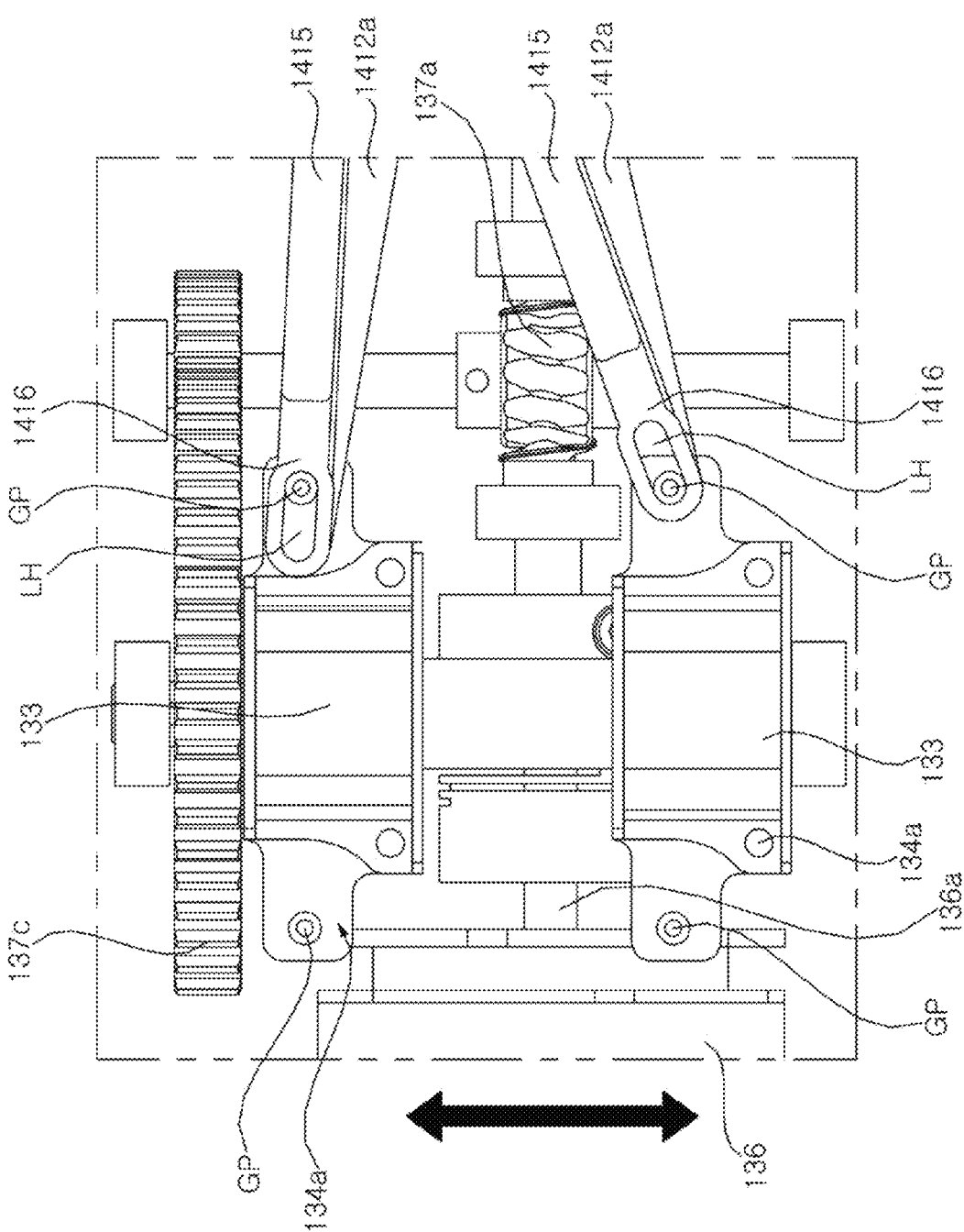

[FIG. 8]
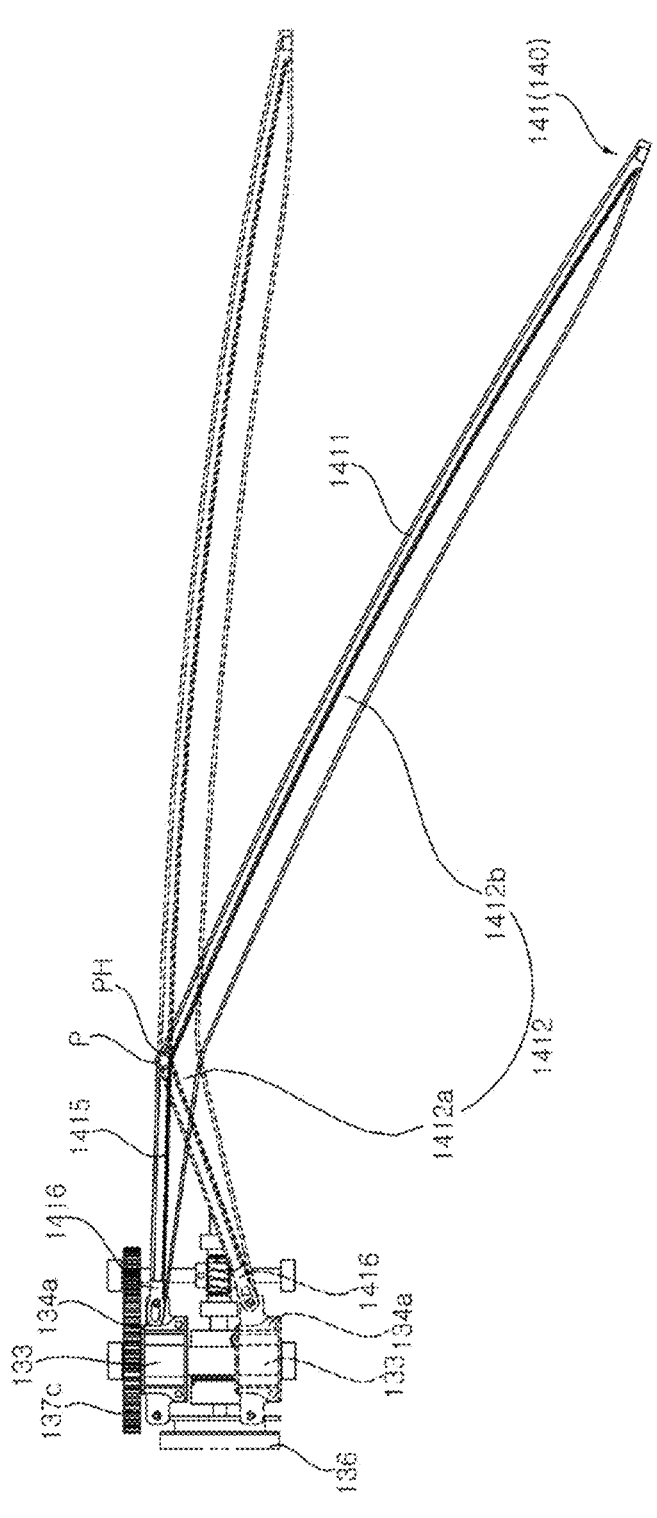

[FIG. 9]
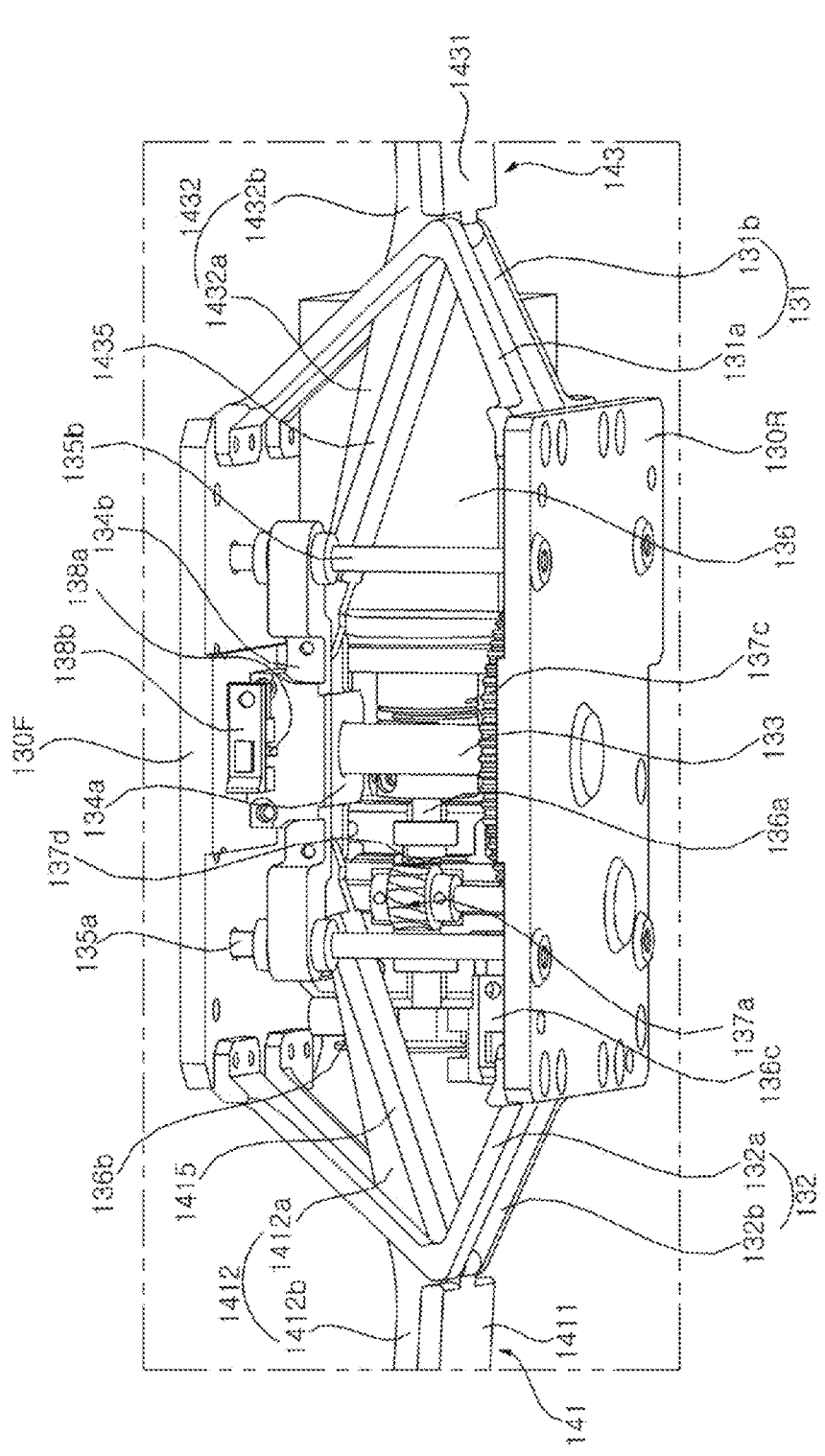

[FIG. 10]
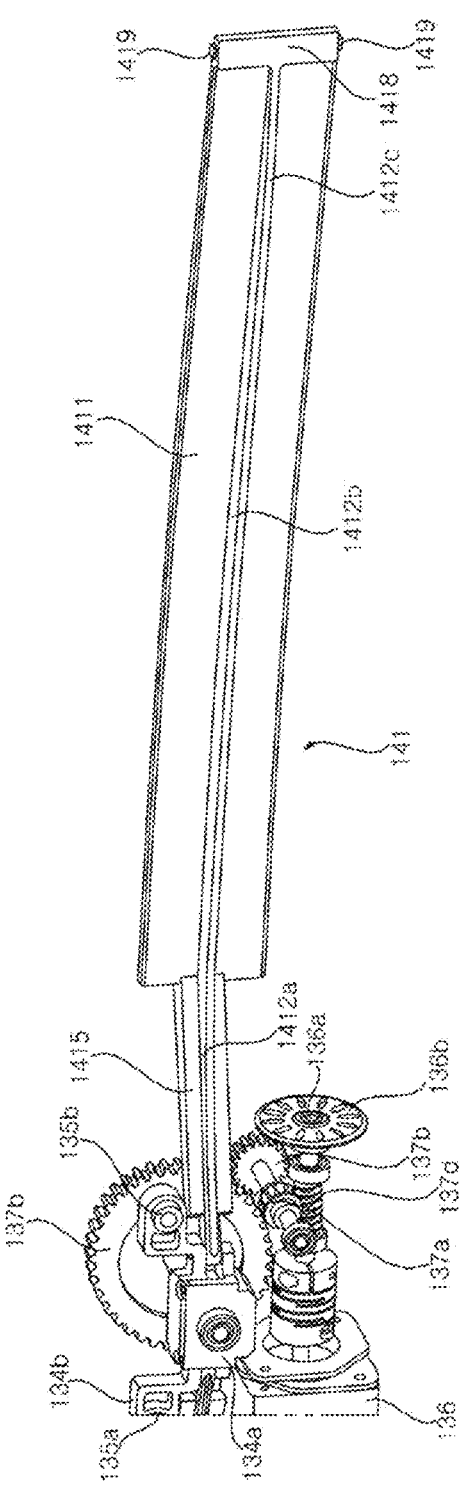

[FIG. 11]
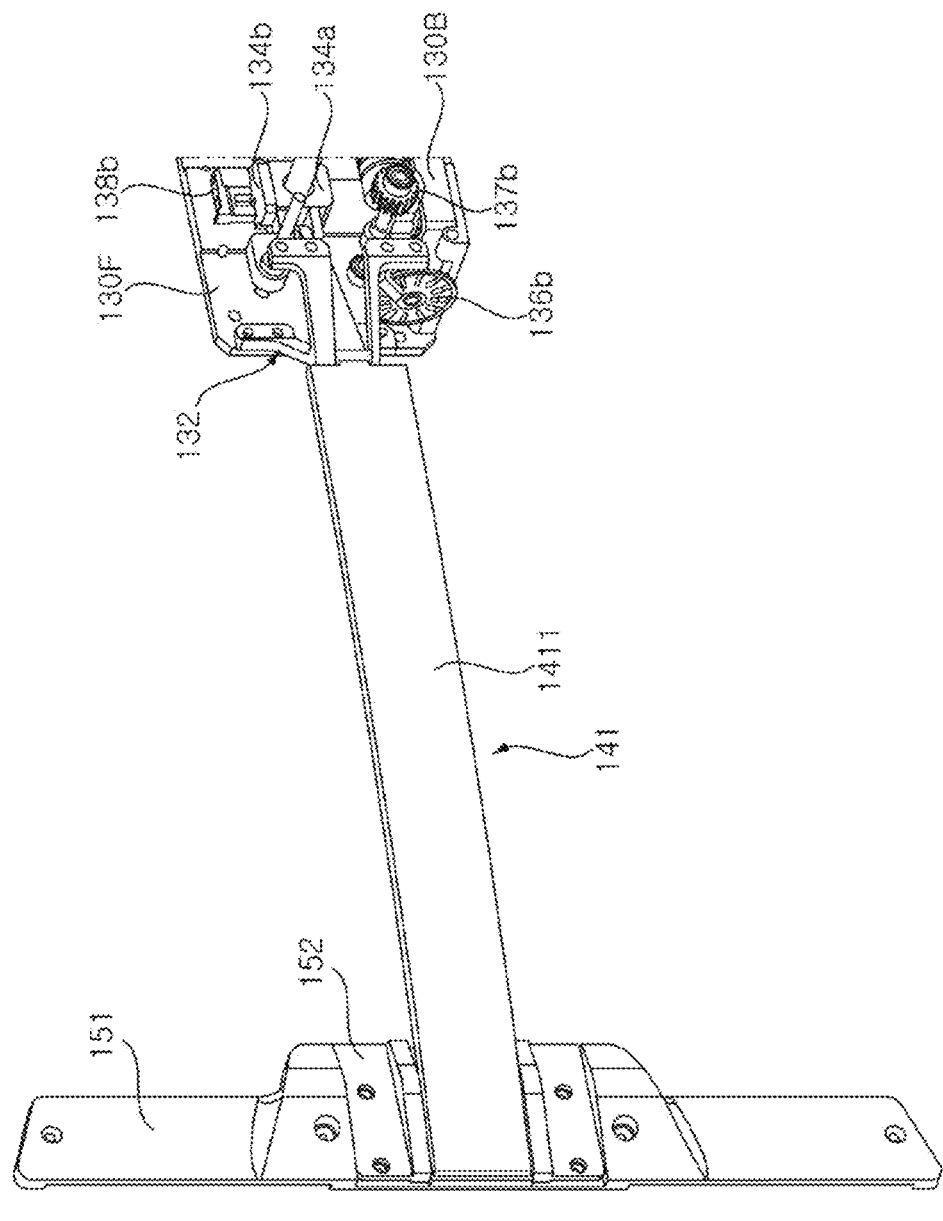

[FIG. 12]
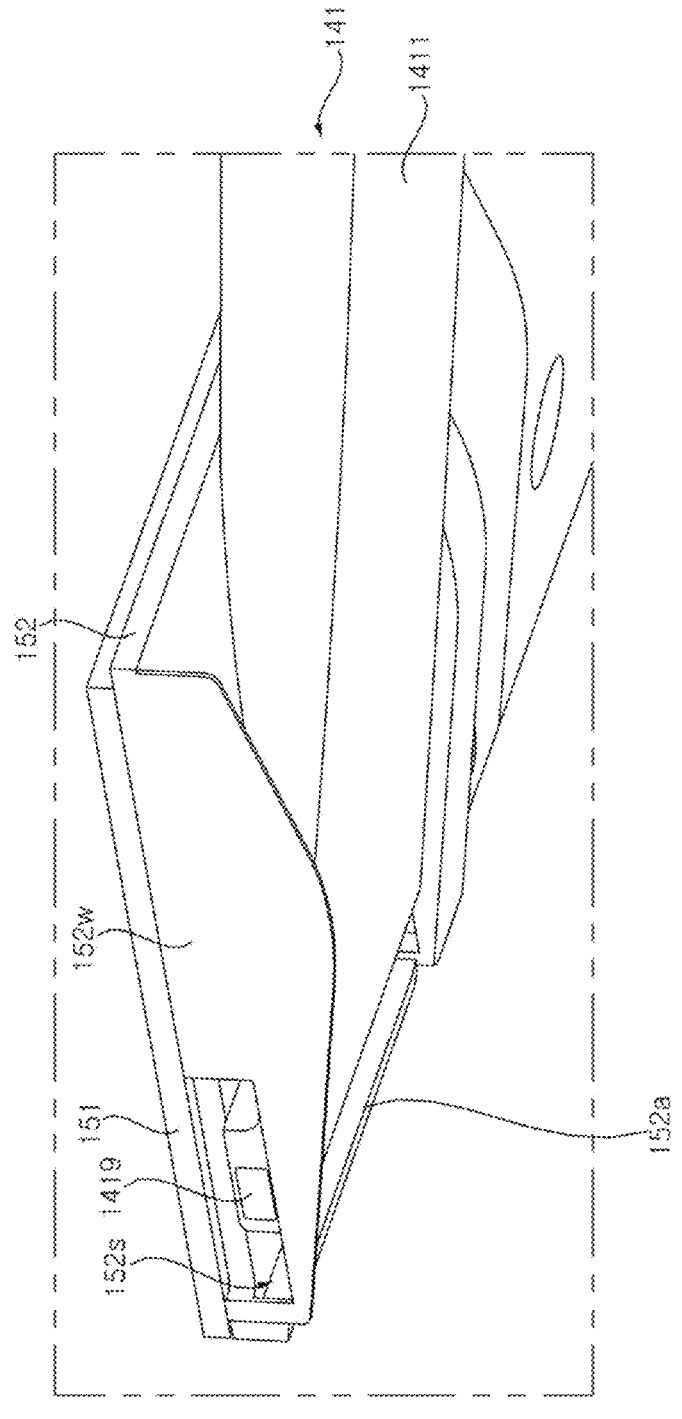

[FIG. 13]
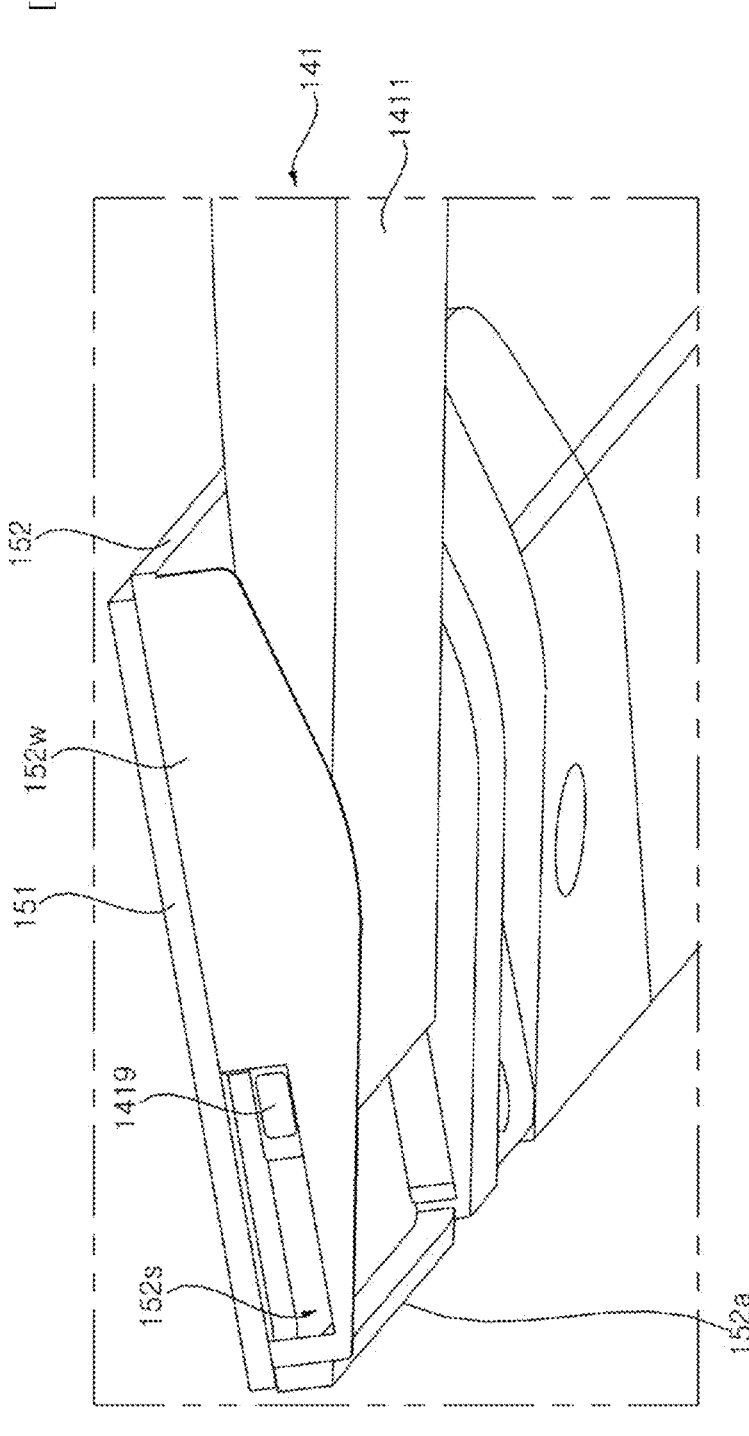

[FIG. 14]
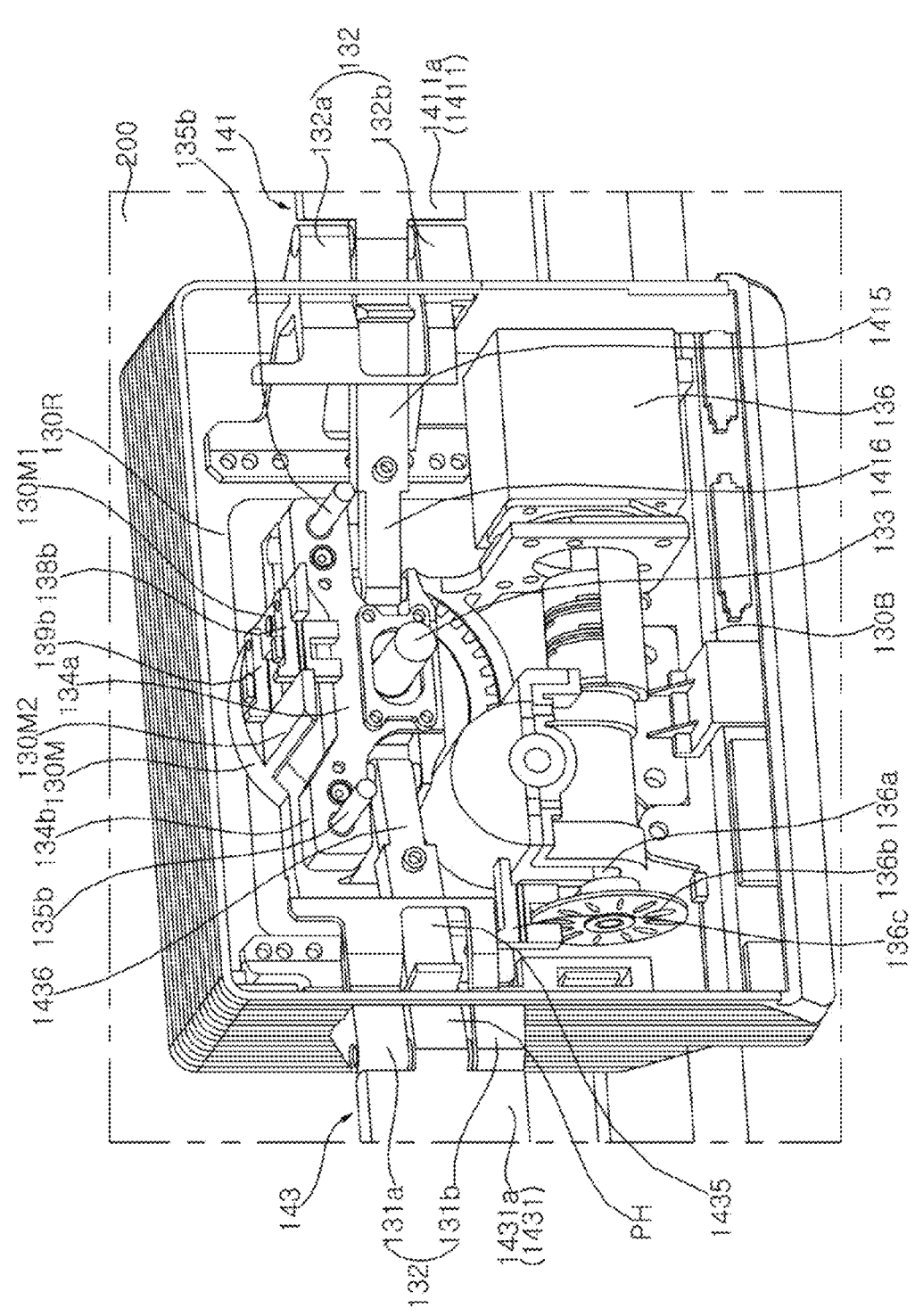

[FIG. 15]
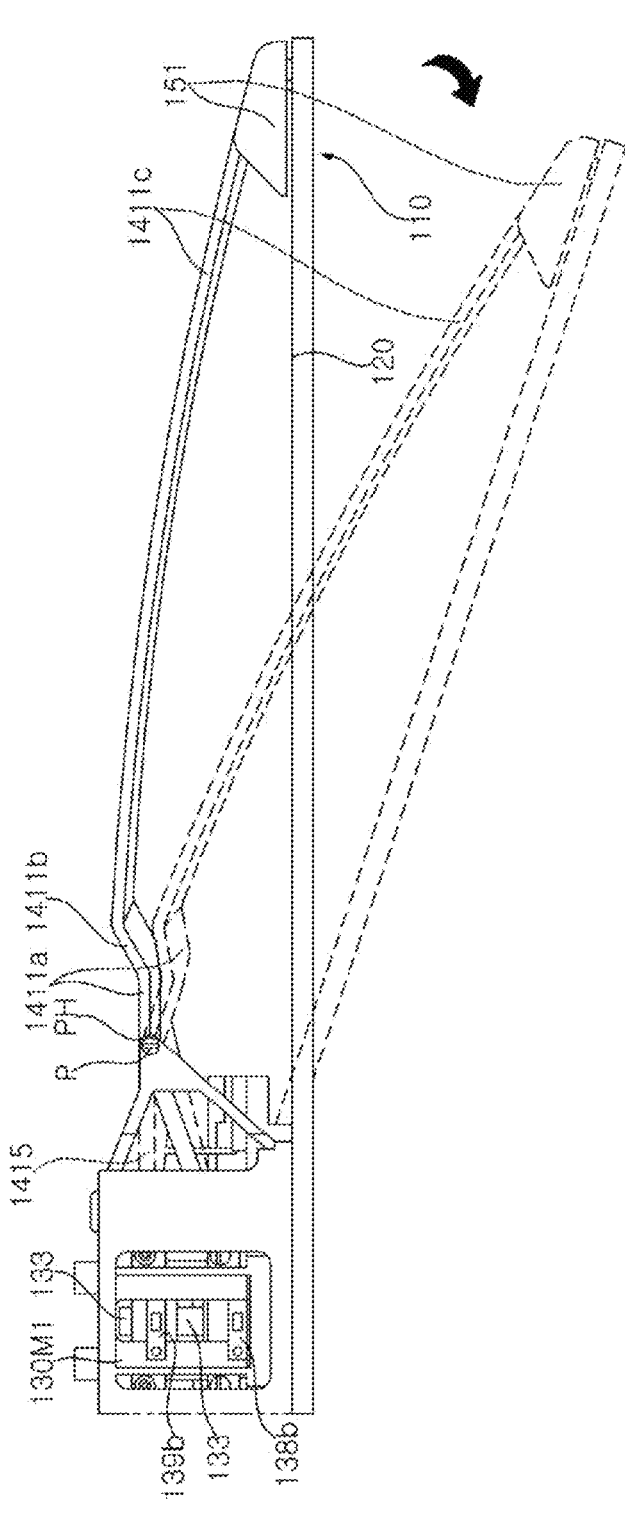

[FIG. 16]
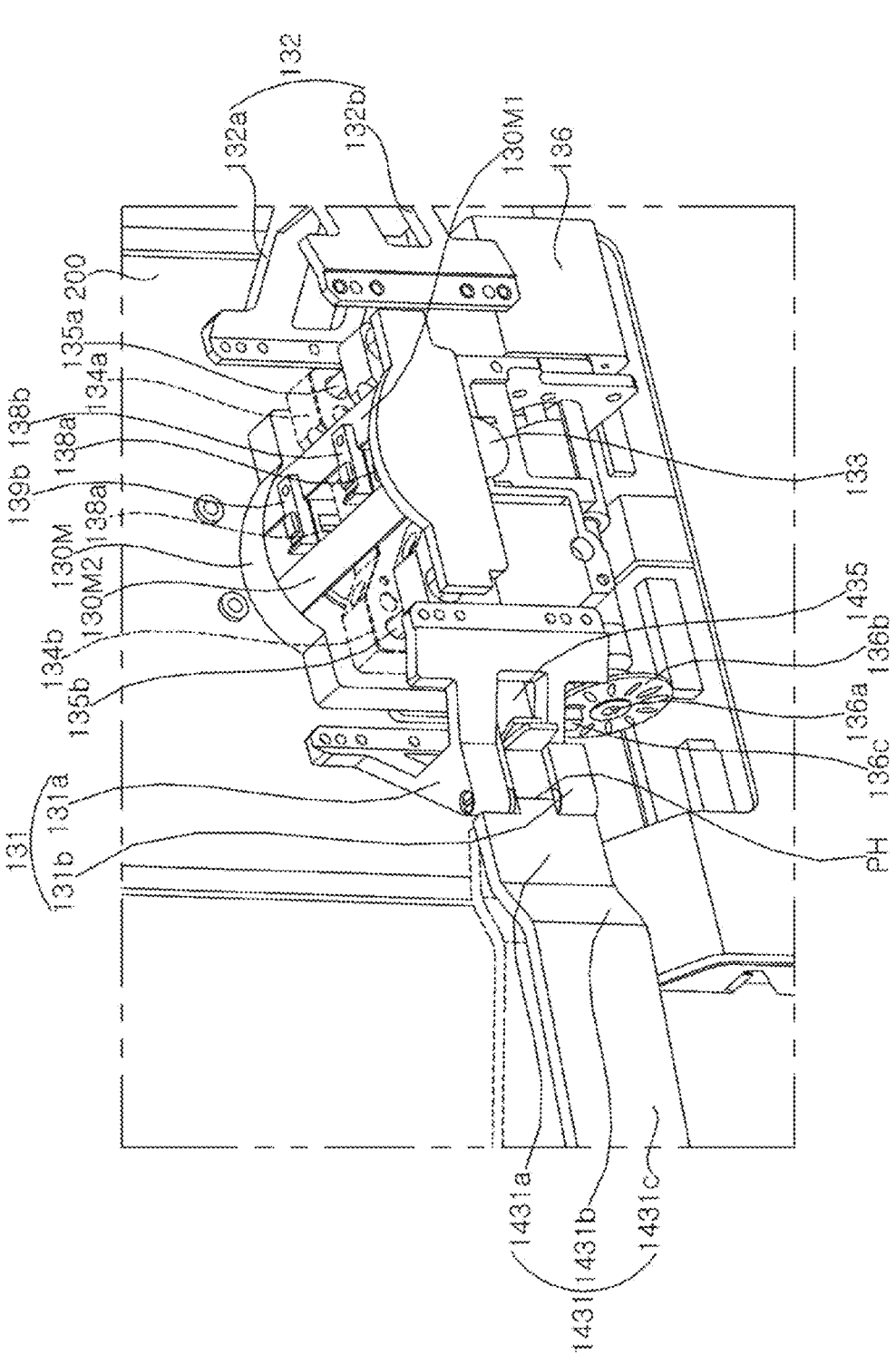

[FIG. 17]

[FIG. 18]
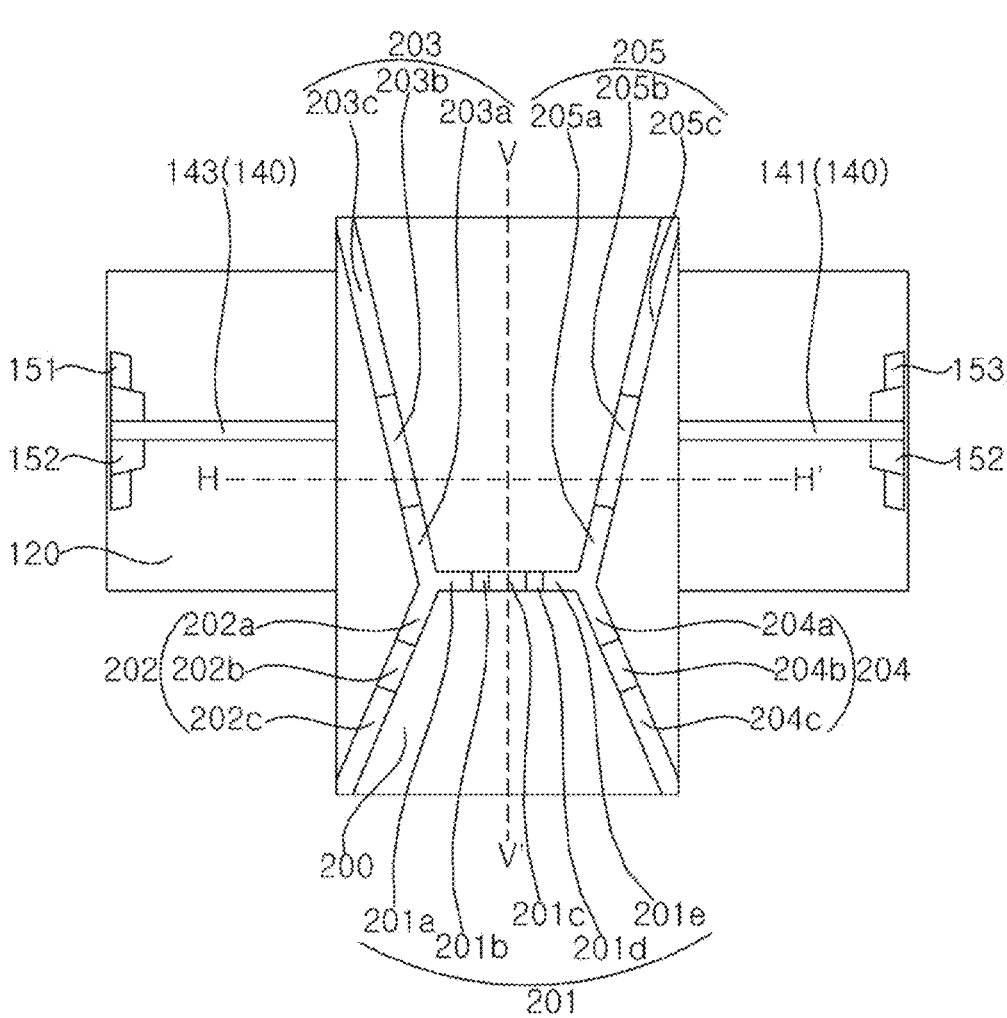

[FIG. 19]
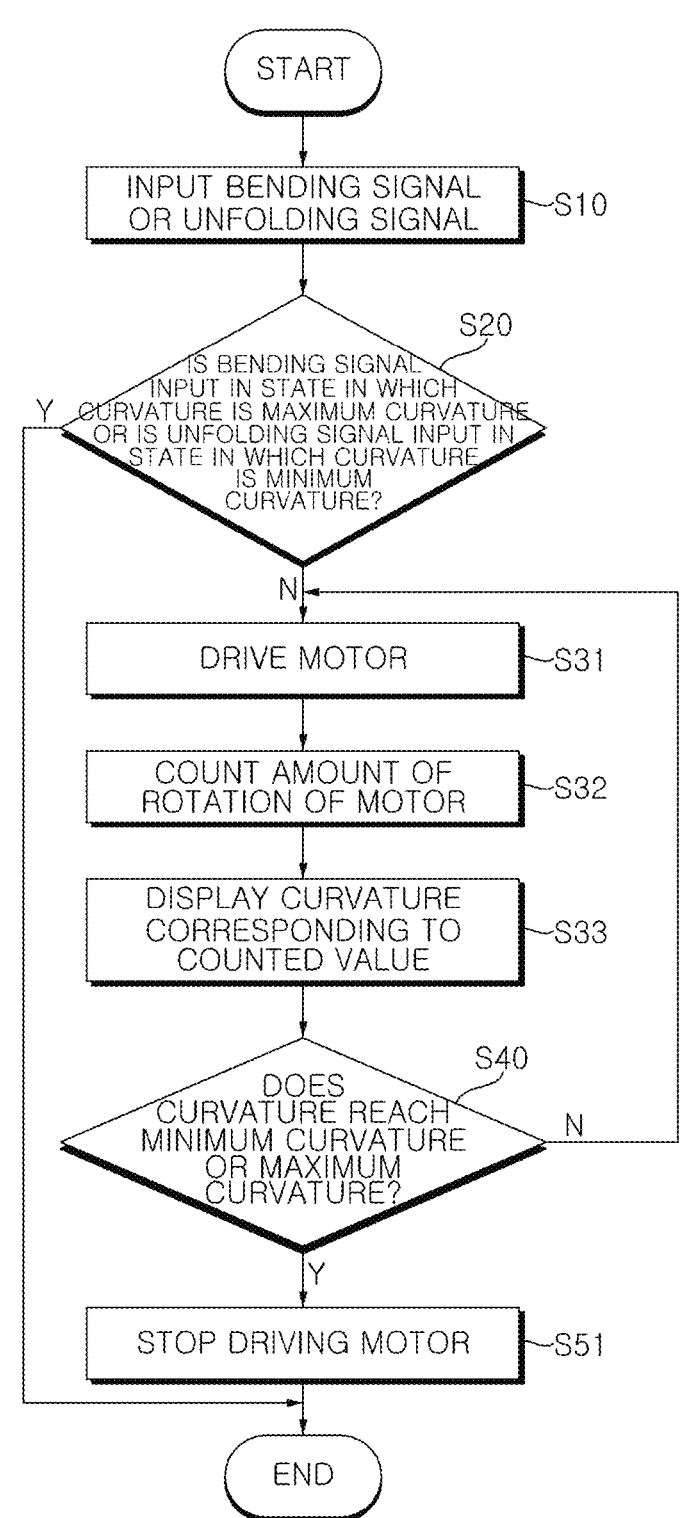

[FIG. 20]
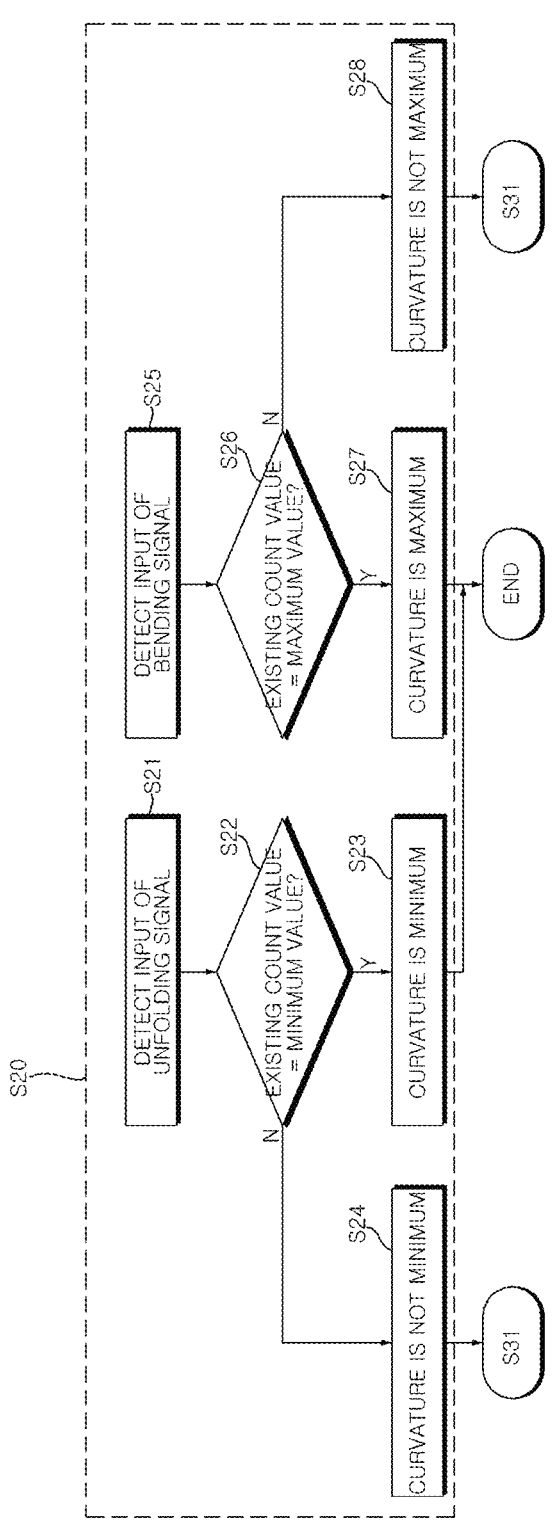

[FIG. 21]
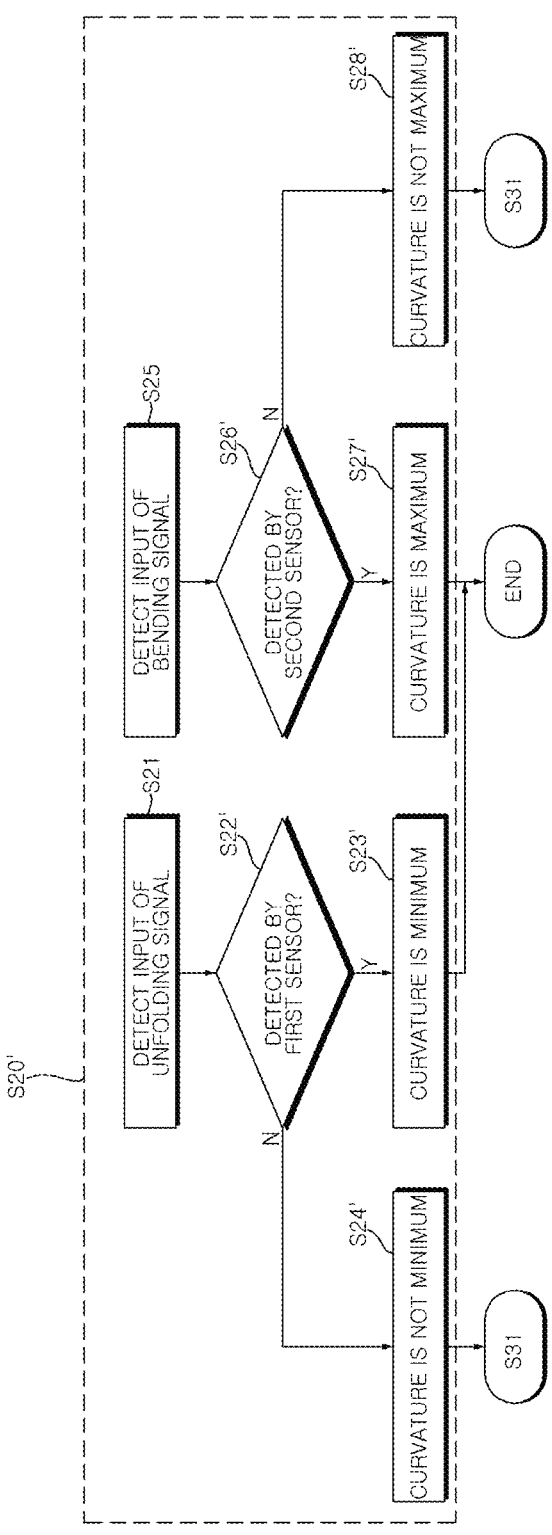

[FIG. 22]

| light | | value | curvature | | sound |
|-------|--|-------|-----------|--|-------|
| L0 | | N0 | R0 | | S0 |
| L1 | | N1 | R1 | | S1 |
| ⋮ | | ⋮ | ⋮ | | ⋮ |
| Ln | | Nn | Rn | | Sn |

[FIG. 23]
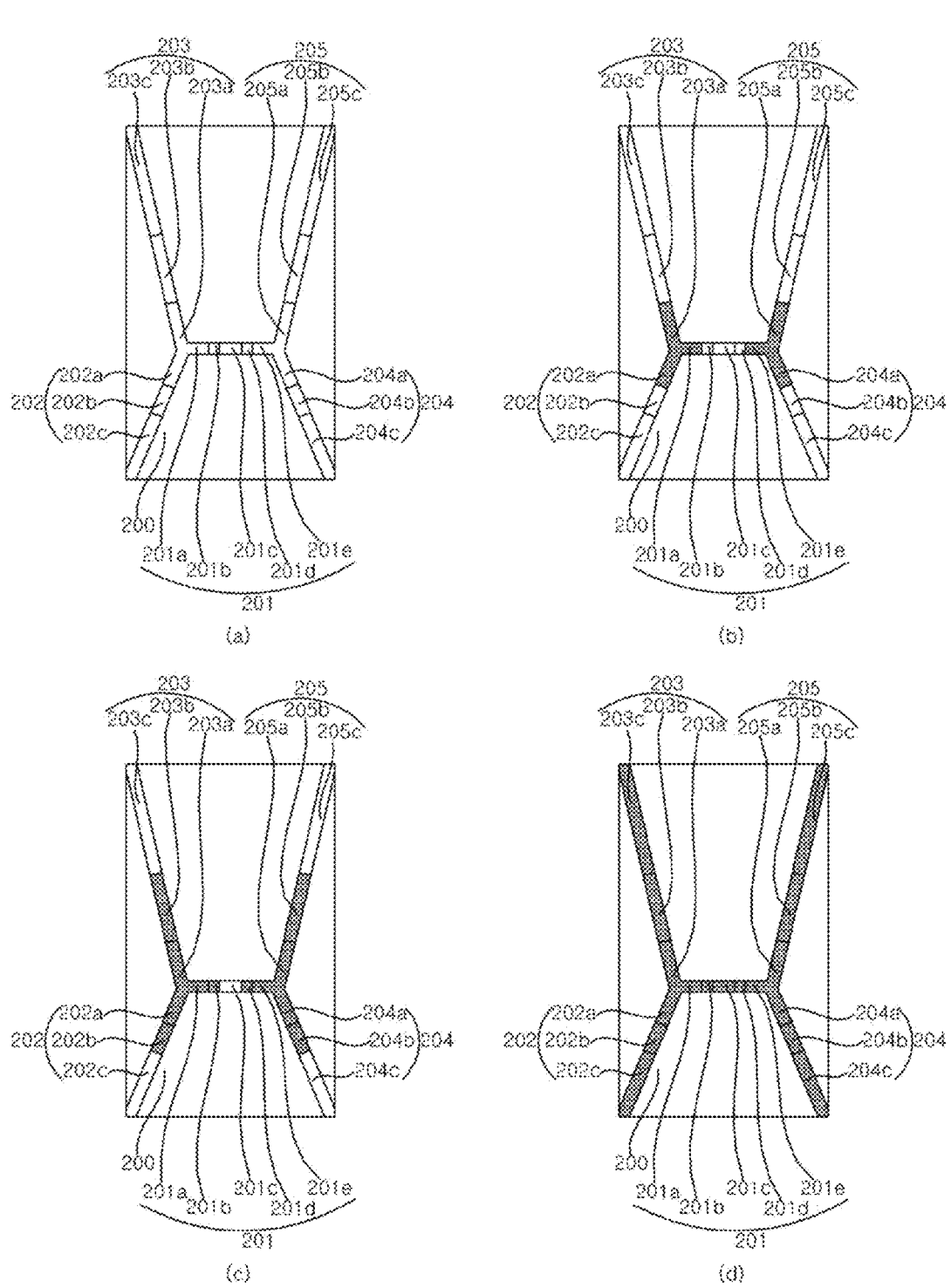
(a)
(b)
(c)
(d)

[FIG. 24]
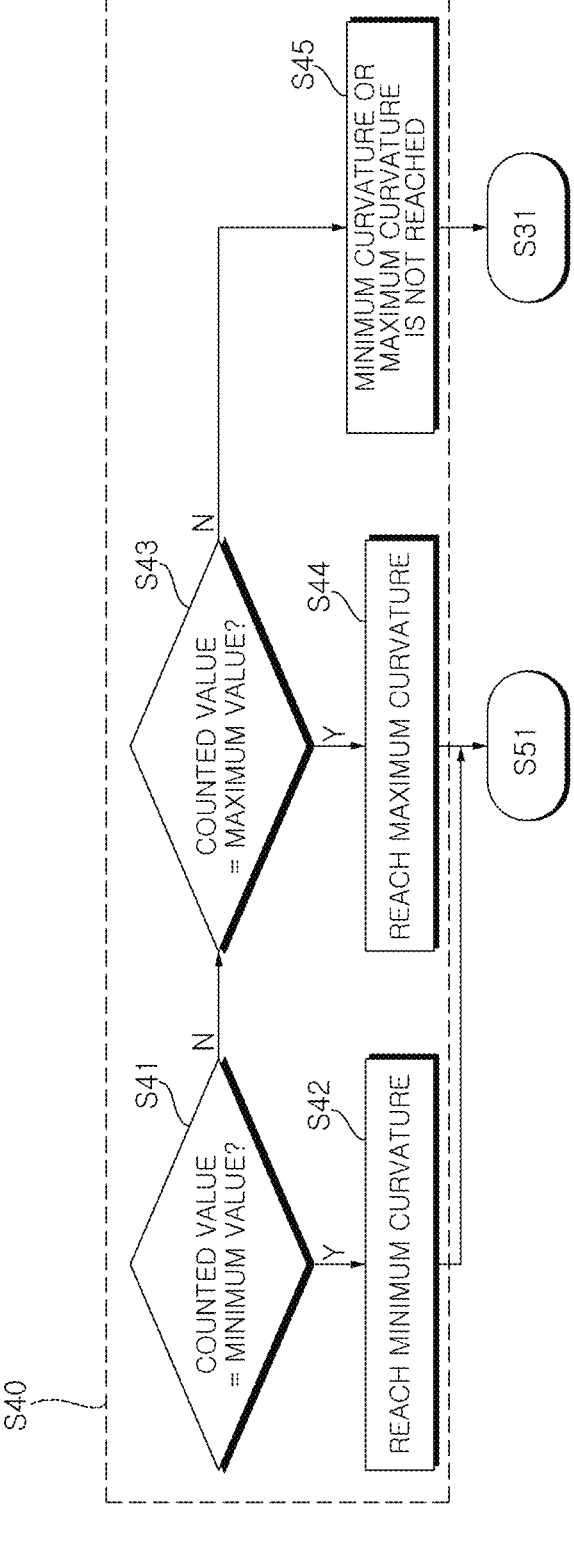

[FIG. 25]
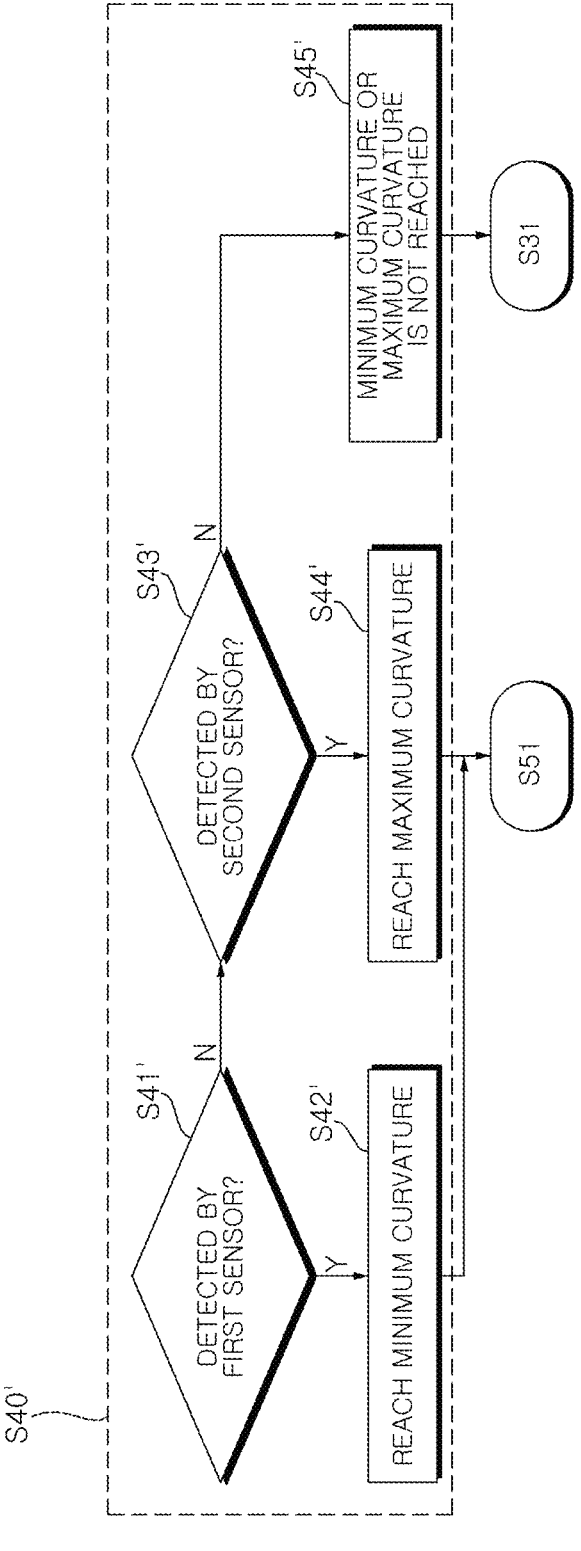

[FIG. 26]
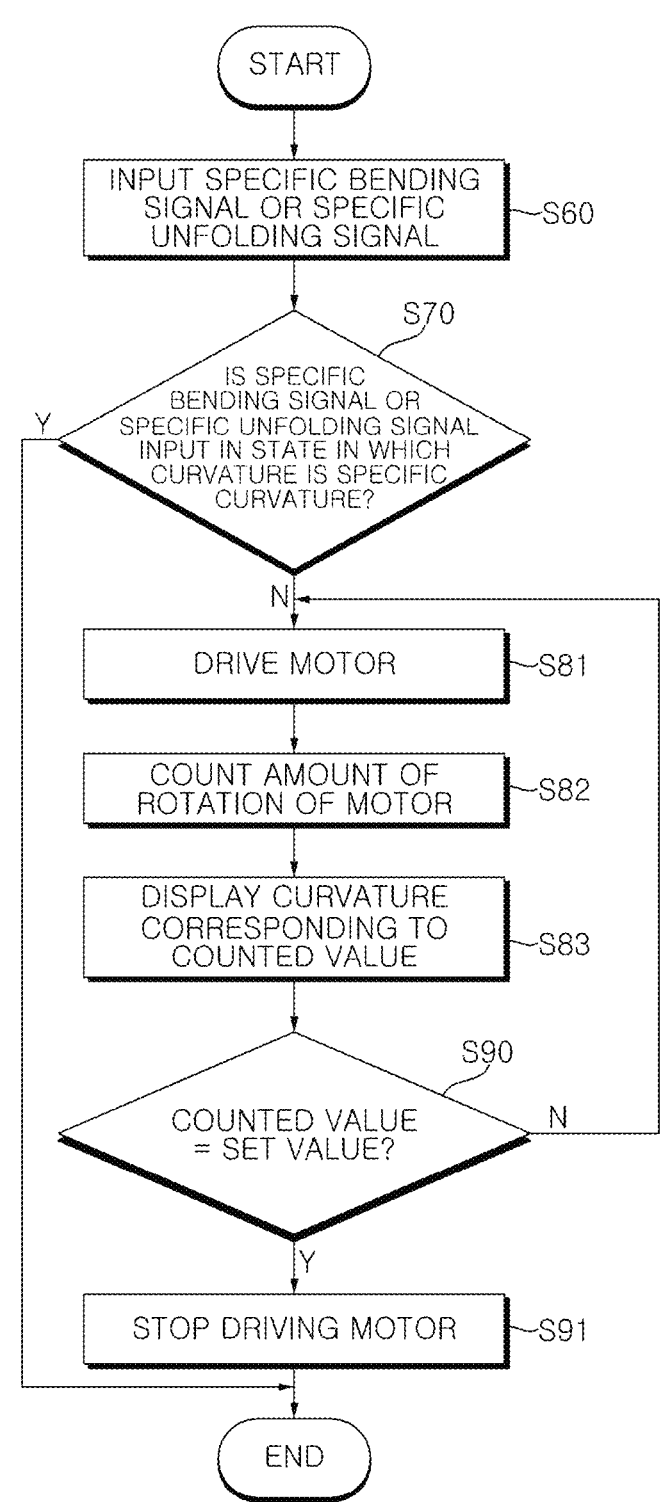

[FIG. 27]
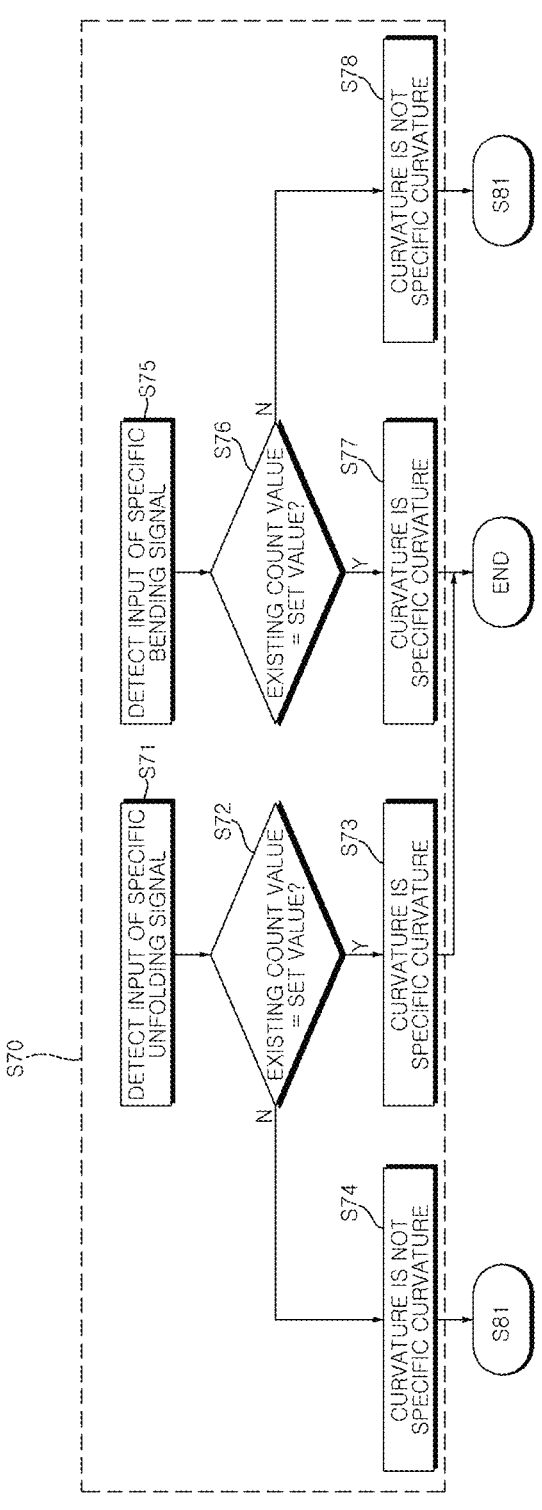

[FIG. 28]
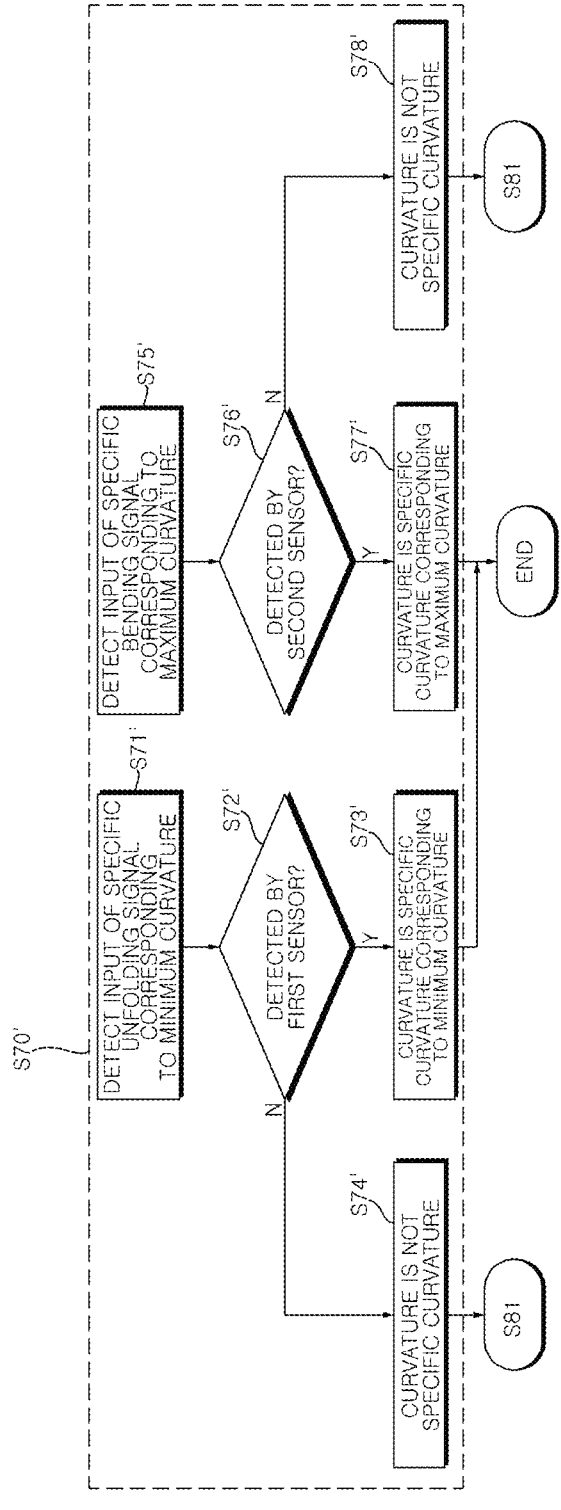

[FIG. 29]
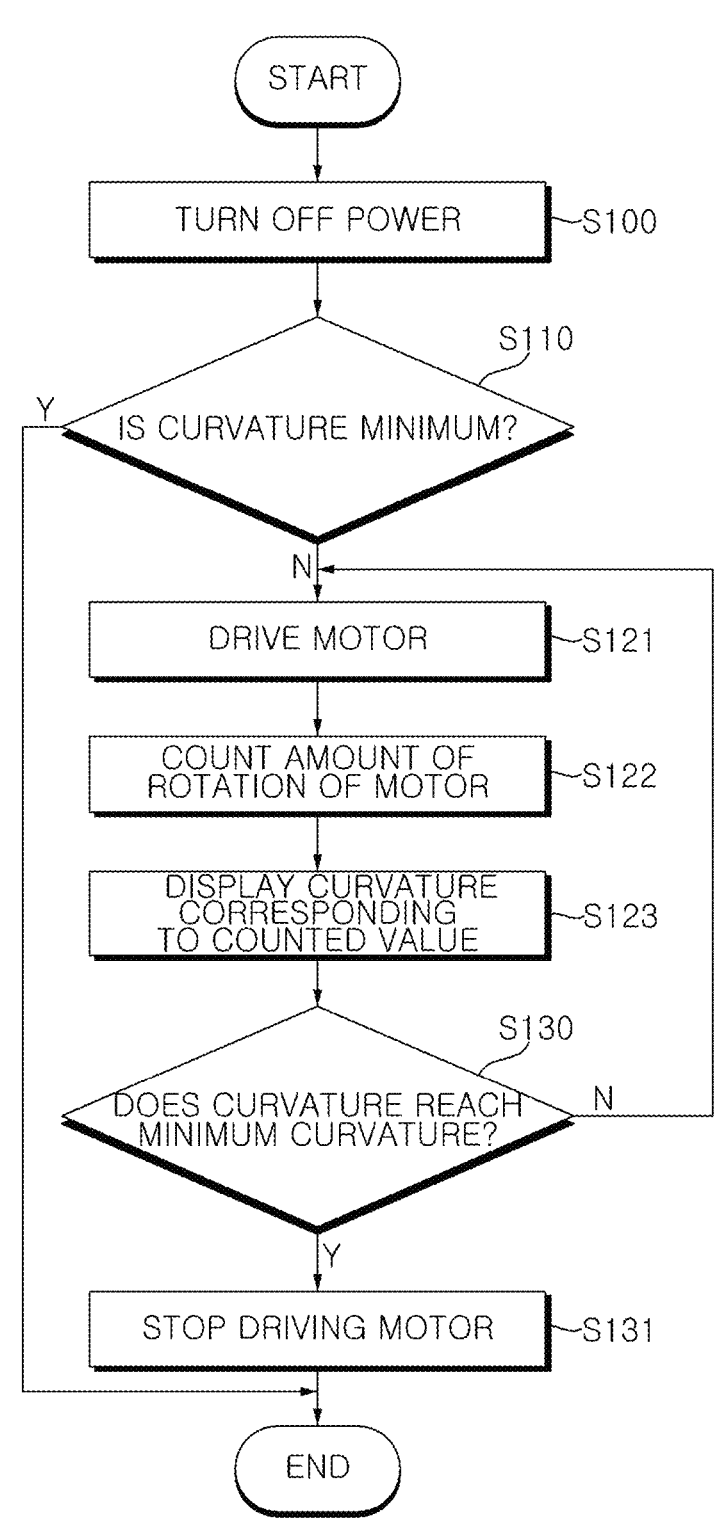

[FIG. 30]
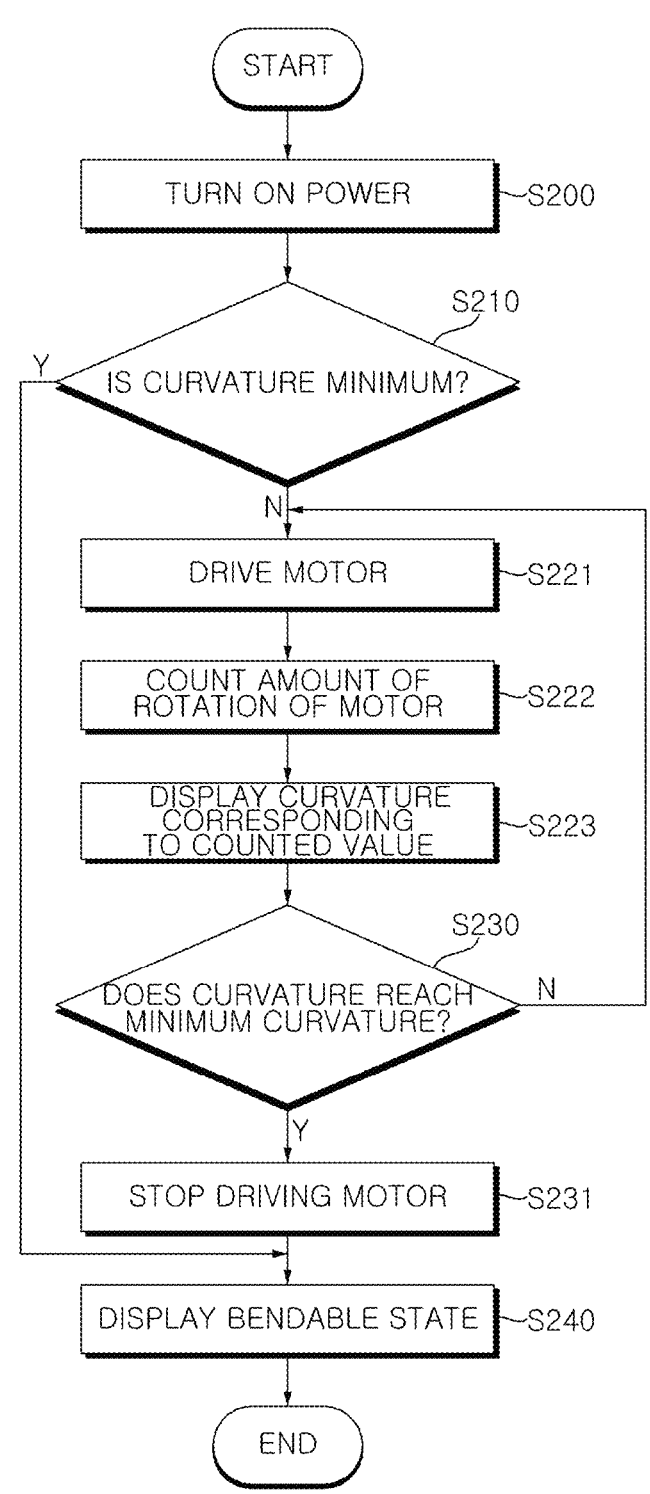

[FIG. 31]
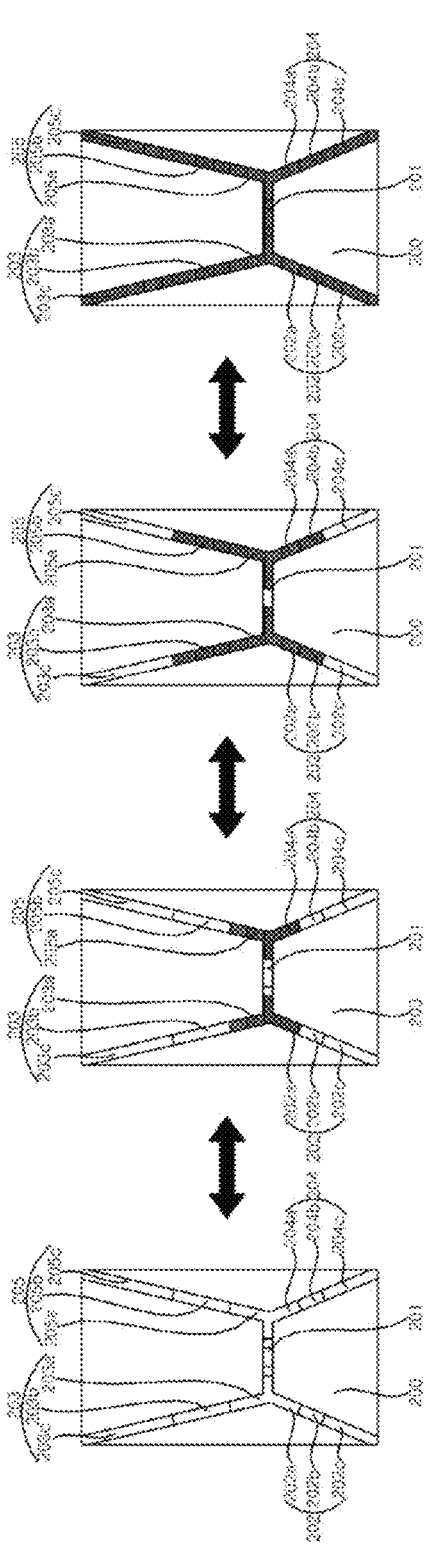

DISPLAY DEVICE

CROSS REFERENCE TO RELATED APPLICATIONS

This application is the National Phase of PCT International Application No. PCT/KR2022/000562, filed on Jan. 12, 2022, all of which is hereby expressly incorporated by reference into the present application.

BACKGROUND

Technical Field

The present disclosure relates to a display device. More specifically, the present disclosure relates to a display device capable of changing a curvature of a display panel.

Discussion of the Related Art

With the development of the information society, there have been growing demands for various types of display devices, and in order to meet these demands, various display devices, such as a liquid crystal display (LCD) device, a Plasma Display Panel (PDP), an electroluminescent display (ELD), a vacuum fluorescent display (VFD), an organic light emitting diode (OLED), etc., have been studied and used recently.

Among them, the OLED panel displays an image by using a self-emitting organic layer deposited on a substrate on which transparent electrodes are formed. The OLED panel is not only thin but also has flexible characteristics. Many studies have been conducted on the structural characteristics of a display device having the OLED panel.

SUMMARY OF THE DISCLOSURE

It is an objective of the present disclosure to solve the above and other problems.

Another object may be to provide a structure for freely changing a curvature of a display panel.

Another object may be to provide a mechanism for freely changing a curvature of a display panel.

Another object may be to provide a structure and method for achieving a curvature of a display panel which is desired by a consumer.

Another object may be to provide a structure and method for controlling a bending or unfolding motion of a display panel by detecting a minimum curvature or a maximum curvature of the display panel.

Another object may be to provide a structure and method for displaying or notifying a curvature of a display panel to a consumer.

In accordance with an aspect of the present disclosure to achieve the above and other objectives, a display device may include: a flexible display panel; a flexible plate which is positioned behind the display panel and to which the display panel is coupled; a driving module positioned behind the plate and coupled to the plate, the driving module including a slider that performs a linear reciprocating motion and a motor providing power to the slider; a wing positioned behind the plate and having one end coupled to the slider and the other end coupled to the plate, the wing including a pivot shaft disposed adjacent to the one end; a sensor detecting at least one of rotation of the motor or a position of the slider;

and a controller controlling operation of the motor based on information obtained from the sensor.

Effect of Invention

The display device according to the present disclosure has the following effects.

According to at least one of the embodiments of the present disclosure, a structure for freely changing a curvature of a display panel may be provided.

According to at least one of the embodiments of the present disclosure, a mechanism for freely changing a curvature of a display panel may be provided.

According to at least one of the embodiments of the present disclosure, there may be provided a structure and method for achieving a curvature of a display panel which is desired by a consumer.

According to at least one of the embodiments of the present disclosure, there may be provided a structure and method for controlling a folding or unfolding motion of a display panel by detecting a minimum curvature or a maximum curvature of the display panel.

According to at least one of the embodiments of the present disclosure, there may be provided a structure and method for displaying or notifying a curvature of a display panel to a consumer.

Further scope of applicability of the present disclosure will become apparent from the detailed description given hereinafter. However, it should be understood that the detailed description and specific examples, while indicating preferred embodiments of the present disclosure, are given by illustration only, since various changes and modifications within the spirit and scope of the present disclosure will become apparent to those skilled in the art from this detailed description.

BRIEF DESCRIPTION OF THE DRAWINGS

FIGS. 1 to 31 are diagrams illustrating examples of a display device according to embodiments of the present disclosure.

DETAILED DESCRIPTION OF THE EMBODIMENTS

Hereinafter, the present disclosure will be described in detail with reference to the accompanying drawings, in which the same reference numerals are used throughout the drawings to designate the same or similar components, and a redundant description thereof will be omitted.

The suffixes, such as "module" and "unit," for elements used in the following description are given simply in view of the ease of the description, and do not have a distinguishing meaning or role.

In addition, it will be noted that a detailed description of known arts will be omitted if it is determined that the detailed description of the known arts can obscure the embodiments of the present disclosure. Further, the accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that, although the terms first, second, etc., may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A singular representation may include a plural representation unless context clearly indicates otherwise.

It should be understood that the terms "comprise," "include," "have," etc. when used in this specification, specify the presence of stated features, integers, steps, operations, elements, components, or combinations thereof but do not preclude the presence or addition of one or more other features, integers, steps, operations, elements, components, or combinations thereof.

The following description will be made using an Organic Light Emitting Diode (OLED) panel as an example of a display panel, but a display panel which is applicable to the present disclosure is not limited to the OLED panel.

In addition, in the following description, the display device may include a first long side LS1, a second long side LS2 opposite to the first long side LS1, a first short side SS1 adjacent to one end of each of the first long side LS1 and the second long side LS2, and a second short side SS2 opposite to the first short side SS1.

Here, an area of the first short side SS1 may be referred to as a first side area, an area of the second short side SS2 may be referred to as a second side area opposite to the first side area, an area of the first long side LS1 may be referred to as a third side area adjacent to the first side area and the second side area and disposed between the first side area and the second side area, and an area of the second long side LS2 may be referred to as a fourth side area adjacent to the first side area and the second side area, disposed between the first side area and the second side area, and opposite to the third side area.

In addition, for convenience of explanation, it is illustrated and described that the first and second long sides LS1 and LS2 are longer than the first and second short sides SS1 and SS2, but it is also possible that the lengths of the first and second long sides LS1 and LS2 may be approximately equal to the lengths of the first and second short sides SS1 and SS2.

Further, in the following description, a first direction DR1 may be a direction parallel to the long sides LS1 and LS2 of the display device, and a second direction DR2 may be a direction parallel to the short sides SS1 and SS2 of the display device. A third direction DR3 may be a direction perpendicular to the first direction DR1 and/or the second direction DR2.

The first direction DR1 and the second direction DR2 may be collectively referred to as a horizontal direction. Further, the third direction DR3 may be referred to as a vertical direction.

A side or a surface, on which the display device displays an image, may be referred to as a front side or a front surface. When the display device displays an image, a side or a surface, at which the image cannot be observed, may be referred to as a rear side or a rear surface. When the display device is viewed from the front side or the front surface, the first long side LS1 may be referred to as an upper side or an upper surface, and the second long side LS2 may be referred to as a lower side or a lower surface. Likewise, the first short side SS1 may be referred to as a left side or a left surface, and the second short side SS2 may be referred to as a right side or a right surface.

In addition, the first long side LS1, the second long side LS2, the first short side SS1, and the second short side SS2 may be referred to as edges of the display device. Further, positions where the first long side LS1, the second long side LS2, the first short side SS1, and the second short side SS2 meet each other may be referred to as corners. For example, a position where the first long side LS1 and the first short side SS1 meet each other may be referred to as a first corner C1, a position where the first long side LS1 and the second short side SS2 meet each other may be referred to as a second corner C2, a position where the second short side SS2 and the second long side LS2 meet each other may be referred to as a third corner C3, and a position where the second long side LS2 and the first short side SS1 meet each other may be referred to as a fourth corner C4.

Here, a direction from the first short side SS1 to the second short side SS2 or a direction from the second short side SS2 to the first short side SS1 may be referred to as a left-right direction LR. A direction from the first long side LS1 to the second long side LS2 or a direction from the second long side LS2 to the first long side LS1 may be referred to as an up-down direction UD.

Referring to FIG. 1, a plate 120 may be flexible. For example, the plate 120 may be a metal plate. The plate 120 may be referred to as a flexible plate 120, a frame 120, or a module cover 120. The display panel 110 may be disposed on a front side or a front surface of the plate 120. The display panel 110 may be flexible. For example, the display panel 110 may be an OLED panel.

The display panel 110 may provide a front surface of a display device 100 and may display an image. The display panel 110 may divide an image into a plurality of pixels and may output the image while controlling color, brightness, and chroma of the respective pixels. The display panel 110 may generate light corresponding to red, green, or blue color in response to a control signal.

The display device 100 may have a variable curvature. The left and right sides of the display device 100 may move forward. For example, when an image is viewed from the front side of the display device 100, the display device 100 may be curved concavely. In this case, the plate 120 may be curved with the same curvature as the display panel 110. Alternatively, the display panel 110 may be curved corresponding to the curvature of the plate 120.

Referring to FIGS. 2 to 3, the plate 120 may be coupled to the rear of the display panel 110. The plate 120 may support the rear of the display panel 110. The plate 120 may have a shape corresponding to the display panel 110.

A driving module 130 may be coupled to the rear of the plate 120. The driving module 130 may include a front bracket 130F, a base 130B, and wing brackets 131 and 132.

The front bracket 130F may be coupled or fixed to a rear side or a rear surface of the plate 120. The front bracket 130F may be in the shape of a flat rectangular plate. The base 130B may be coupled or fixed to the front bracket 130F, and may form the bottom of the driving module 130.

There may be a plurality of wing brackets 131 and 132. The plurality of wing brackets 131 and 132 may include a first wing bracket 131 and a second wing bracket 132. The first wing bracket 131 may be coupled or fixed to the front bracket 130F, and may face the second wing bracket 132. The second wing bracket 132 may also be coupled or fixed to the front bracket 130F.

The wing brackets 131 and 132 may have a "V" shape. The wing brackets 131 and 132 may be a pair of brackets 131 and 132. Upper brackets 131*a* and 132*a* of the wing brackets 131 and 312 may be disposed parallel to lower brackets 131*b* and 132*b*. A pin P may be disposed between the upper bracket 131*a* and 132*a* and the lower bracket 131*b* and 132*b*. The pin P may connect vertices or apexes of the upper bracket 131*a* and 132*a* and the lower bracket 131*b* and 132*b*.

The first wing 143 may be rotatably coupled to the first wing bracket 131, and the second wing 141 may be rotatably coupled to the second wing bracket 132. The first wing 143 may be axisymmetric to the second wing 141 with respect to the driving unit 130.

Referring to FIGS. 4 and 5, the first wing 143 may be pivotally connected to the first wing bracket 131. A description of the first wing 143 and the first wing bracket 131 may be applied to the second wing 141 and the second wing bracket 132. The first wing 143 may include a wing plate 1431, a rib 1432, a wing end 1433, a pivot shaft PH, and a lever 1435.

The wing plate 1431 may be an elongated plate. The lever 1435 may extend from one end of the wing plate 1431. The lever 1435 may be an elongated plate. A length of the lever 1435 may be smaller than a length of the wing plate 1431, and a width of the lever 1435 may be smaller than a width of the wing plate 1431. A thickness of the wing plate 1431 may be substantially equal to a thickness of the lever 1435.

Referring together to FIG. 2, ribs 1412 and 1432 may be elongated in a longitudinal direction of the wing plates 1411 and 1431 and the levers 1415 and 1435 to be formed on one surface of the wing plates 1411 and 1431 and the levers 1415 and 1435. The ribs 1412 and 1432 may intersect a width direction of the wing plates 1411 and 1431 and the levers 1415 and 1435. The wing plates 1411 and 1431 may be gently curved, and the levers 1415 and 1435 may be bent to be connected to the wing plates 1411 and 1431. The ribs 1412 and 1432 may include first ribs 1412*a* and 1432*a* and second ribs 1412*b* and 1432*b*. The width of the first ribs 1412*a* and 1432*a* may gradually decrease away from the pivot shaft PH. The width of the second ribs 1412*b* and 1432*b* may be substantially equal to the width of the first ribs 1412*a* and 1432*a* disposed adjacent to the pivot shaft PH.

In FIG. 5, the pivot shaft PH of the wings 141 and 143 may be pivotally connected to the pin P of the wing brackets 131 and 132. The pin P may be inserted into the pivot shaft PH of the wings 141 and 143. The wings 141 and 143 may rotate or pivot about the pin P at the wing brackets 131 and 132. The thickness of the pivot shaft PH may be greater than the thickness of the wing plates 1411 and 1431 and/or the levers 1415 and 1435. Accordingly, structural rigidity of the wing 140 during driving may be improved.

Referring to FIGS. 5 and 6, a lead screw 133 may be rotatably mounted in the front bracket 130F. For example, the lead screw 133 may be elongated and may have a screw thread formed on an outer surface thereof. The lead screw 133 may be inserted into a slider 134*a*. The slider 134*a* may be coupled by screw thread coupling to the lead screw 133. When the lead screw 133 is rotated, the slider 134*a* may reciprocate in a longitudinal direction of the lead screw 133.

A slider guide 134*b* may be fixed onto the slider 134*a*. The slider guide 134*b* may be moved together with the slider 134*a*. Guide shafts 135*a* and 135*b* may be coupled or fixed to the front bracket 130F. The guide shafts 135*a* and 135*b* may be parallel to the lead screw 134*b*. The guide shafts 135*a* and 135*b* may include a first guide shaft 135*a* and a second guide shaft 135*b*. The first guide shaft 135*a* may be disposed opposite to the second guide shaft 135*b* with respect to the lead screw 133. The guide shafts 135*a* and 135*b* may be inserted into the slider guide 134*b*. Accordingly, by the rotation of the lead screw 133, the slider 134*a* may stably reciprocate in the longitudinal direction of the lead screw 133.

A motor 136 may be mounted on the base 130B. The motor 136 may be an electric motor. The motor 136 may be a step motor. The motor 136 may control the number of steps corresponding to a rotation angle, and the direction and speed of rotation. A rotating shaft 136*a* of the motor 136 may intersect the longitudinal direction of the lead screw 133. The motor 136 and the rotating shaft 136*a* of the motor 136 may be disposed between the lead screw 133 and the base 130B. A worm 137*d* may be fixed to the rotating shaft 136*a* of the motor 136, and may rotate together with the rotating shaft 136*a* of the motor 136. A worm gear 137*a* may mesh with the worm 137*d*. A transmission gear 137*b* may rotate coaxially with the worm gear 137*a*. A drive gear 137*c* may be fixed to one end of the lead screw 133 to rotate together with the lead screw 133. The drive gear 137*c* may mesh with the transmission gear 137*b*. A diameter of the drive gear 137*c* may be greater than a diameter of the transmission gear 137*b*.

Referring to FIGS. 7 and 8, a wing 141 may include a connecting rod 1416. The connecting rod 1416 may be fixed to the lever 1415 or may extend from the lever 1415. The connecting rod 1416 may be connected to the slider 134*a*. The connecting rod 1416 may be pivotally connected to the slider 134*a*. The connecting rod 1416 may include a long hole LH. The long hole LH may be formed in a distal end of the connecting rod 1416 which is adjacent to the slider 134*a*. The slider 134*a* may include a connecting pin GP. The connecting pin GP may have a cylindrical shape. A diameter of the connecting pin GP may be substantially equal to a width of the long hole LH.

When the lead screw 133 rotates, the slider 134*a* may reciprocate in the longitudinal direction of the lead screw 133. The lever 1415 that is connected to the slider 134*a* by the connecting rod 1416 may move together with the slider 134*a*, and the wing 141 may pivot about the pivot shaft PH. In this case, the connecting pin GP may move inside the long hole LH.

Referring to FIG. 9, a rear bracket 130R may be coupled to the wing brackets 131 and 132. The rear bracket 130R may be opposite to the front bracket 130F. The lead screw 133 may connect the front bracket 130F and the rear bracket 130R.

The guide shafts 135*a* and 135*b* may be coupled to the front bracket 130F and the rear bracket 130R. A length of the lead screw 133 and/or a length of the guide shaft 135*a* and 135*b* may correspond to a distance between the front bracket 130F and the rear bracket 130R.

The wing brackets 131 and 132 may be coupled to the front bracket 130F and the rear bracket 130R. A first end of the wing brackets 131 and 132 may be coupled or fixed to the front bracket 130F, and a second end of the wing brackets 131 and 132 may be coupled or fixed to the rear bracket 130R.

Referring to FIG. 10, the wing 141 may include a wing end 1418 and an end rib 1412*c*. The wing end 1418 may form a distal end of the wing plate 1411. A thickness of the wing end 1418 may be greater than a thickness of the wing plate 1411.

The end rib 1412*c* may be referred to as a third rib 1412*c*. The third rib 1412*c* may connect the wing end 1418 from the second rib 1412*b*. The third rib 1412*c* may extend in the longitudinal direction of the second rib 1412*b*, and may be formed on the wing plate 1411.

A longitudinal direction of the third rib 1412*c* may form a predetermined angle with respect to the longitudinal direction of the second rib 1412*b*. For example, the longitudinal direction of the second rib 1412*b* may form an obtuse angle with respect to the longitudinal direction of the third rib 1412*c*.

The end pin 1419 may be formed on the wing end 1418. The end pin 1419 may protrude from one end surface and/or another end surface of the wing end 1418.

Referring to FIGS. 11 to 13, side frames 151 and 153 (see FIG. 2) may be coupled or fixed to a rear side or rear surface of the plate 120. The side frame 151 may include a sliding mount 152. The sliding mount 152 may be mounted or fixed onto the side frame 151.

The wing 141 may be coupled to the sliding mount 152 so as to be movable on the sliding mount 152. As the wing 141 moves on the sliding mount 152, the third rib 1412*c* and the wing end 1418 may contact the sliding mount 152. As the third rib 1412*c* and the wing end 1418 contact the sliding mount 152, a bending force of the wing 141 to bend the plate 120 may be effectively transmitted.

The sliding mount 152 may include a side wall 152W. The side wall 152W may face a side surface of the wing plate 1411. The wing plate 1411 may come into contact with the side wall 152W while moving on the sliding mount 152. The side wall 152W may guide movement of the wing plate 1411.

A guide slot 152S may be formed in the side wall 152W. The guide slot 152S may be elongated while passing through the sidewall 152W in the longitudinal direction of the wing plate 1411. For example, the guide slot 152S may have a rectangular shape.

The end pin 1419 may be inserted into the guide slot 152S. The end pin 1419 may move in the guide slot 152S. Along with the guide slot 152S, the end pin 1419 may limit the movement of the wing plate 1411. For example, the end pin 1419 may have a rectangular cross-section.

Accordingly, a force transmitted by the wing plate 1411 to the side frame 151 may be maintained constant. In addition, the display panel 110 and the plate 120 are curved, thereby improving flattening of portions adjacent to both ends of the display panel 110 and the plate 120.

The sliding mount 152 may have a stopper 52*a* formed as a bent end. When the plate 120 remains flat, the wing end 1418 may come into contact with the stopper 152*a* of the sliding mount 152. Accordingly, both ends of the plate 120 are directed toward the rear side of the display device 100, thereby preventing the front surface of the display panel 110 from being convexly curved.

Referring to FIGS. 14 to 16, an indicator 136*b* may be adjacent to an end of the rotating shaft 136*a* of the motor 136 and may be fixed to the rotating shaft 136*a*. The indicator 136*b* may have a circular plate shape and may have a plurality of holes (not numbered) which are spaced apart from each other in a circumferential direction of the indicator 136*b*. For example, the number of holes may be 12.

A counter sensor 136*c* may be adjacent to the indicator 136*b* and may be fixed to the base 130B or the wing bracket 132. The counter sensor 136*c* may be a photo sensor. The counter sensor 136*c* may have a horseshoe shape. A light emitter and a light receiver of the counter sensor 136*c* may face each other with a distance therebetween. The indicator 136*b* may rotate while passing through the light emitter and the light receiver of the counter sensor 136*c* when the rotating shaft 136*a* rotates. In response to the rotation of the indicator 136*b*, light of the light emitter of the counter sensor 136*c* may pass through the holes of the indicator 136*b* or may be blocked by the indicator 136*b*.

Accordingly, the counter sensor 136*c* may detect the number and/or amount of rotation of the motor 136.

A mount 130M may be adjacent to an outer circumference of the drive gear 137*c* and may be fixed to the rear bracket 130R. Extension parts 130M1 and 130M2 may extend from the mount 130M in a direction parallel to the lead screw 133. The extension parts 130M1 and 130M2 may be disposed above the slider 134*a* or the slider guide 134*b*.

A pin indicator 138*a* may be fixed onto the slider 134*a* or the slider guide 134*b*. The pin indicator 138*a* may have a pin shape.

A first sensor 138*b* may be coupled to the extension part 130M1. Alternatively, the first sensor 138*b* may be coupled to the front bracket 130F. The first sensor 138*b* may be a photo sensor. The first sensor 138*b* may have a horseshoe shape. A light emitter and a light receiver of the first sensor 138*b* may face each other with a distance therebetween. As the slider 134*a* performs a linear reciprocating motion, the pin indicator 138*a* may pass between the light emitter and the light receiver of the first sensor 138*b*. In response to the movement of the pin indicator 138*a*, light of the light emitter of the first sensor 138*b* may be provided to the light receiver of the first sensor 138*b* or may be blocked by the pin indicator 138*a*.

Accordingly, the first sensor 138*b* may detect the approach of the pin indicator 138*a*. When the slider 134*a* is located closer to the front bracket 130F, the first sensor 138*b* may detect the pin indicator 138*a* (see FIGS. 7 and 15). In this case, the display panel 110 may have a minimum curvature, and this position may be referred to as a start point of the slider 134*a*. For example, the minimum curvature may be "zero (0)," and the display panel 110 may be flat.

The second sensor 139*b* may be spaced rearward from the first sensor 138*b* and may be coupled to the extension part 130M1. Alternatively, the second sensor 139*b* may be coupled to the rear bracket 130R. The second sensor 139*b* may be a photo sensor. The second sensor 139*b* may have a horseshoe shape. A light emitter and a light receiver of the second sensor 139*b* may face each other with a distance therebetween. As the slider 134*a* performs a linear reciprocating motion, the pin indicator 138*a* may pass between the light emitter and the light receiver of the second sensor 139*b*. In response to the movement of the pin indicator 138*a*, light of the light emitter of the second sensor 139*b* may be provided to the light receiver of the second sensor 139*b* or may be blocked by the pin indicator 138*a*.

Accordingly, the second sensor 139*b* may detect the approach of the pin indicator 138*a*. When the slider 134*a* is located closer to the front bracket 130F, the second sensor 139*b* may detect the pin indicator 138*a* (see FIGS. 7 and 15). In this case, the display panel 110 may have a maximum curvature, and this position may be referred to as a terminal point of the slider 134*a*. For example, a maximum radius of curvature may be 1,000 mm or 800 mm.

Meanwhile, the display device may include at least one of the counter sensor 136*c*, the first sensor 138*b*, or the second sensor 139*b* which are described above.

Referring back to FIG. 15, the wing plate 1411 may include a first part 1411*a*, a second part 1411*b*, and a third part 1411*c*. The first part 1411*a* may be disposed opposite the wing plate 1411 and the lever 1415 with respect to the pivot shaft PH. The first part 1411*a* may be bent from the lever 1415 and may form an obtuse angle with respect to the lever 1415. The second part 1411*b* may be bent from the first part 1411*a*, may be substantially parallel to the lever 1415, and may form an obtuse angle with respect to the first part 1411*a*. The third part 141*c* may be bent from the second part 1411*b*, may be substantially parallel to the first part 1411*a*, and may form an obtuse angle with respect to the second part 1411*b*.

Accordingly, structural rigidity of the wing 141 may be improved. A rib (not shown) intersecting the wing 141 may be formed on an inner surface of the lever 1415 and the first part 1411*a*, thereby further improving the structural rigidity of the wing 141. Meanwhile, a modified example of the aforesaid wing 141 may also be applied to the wing 143.

Figure 17:
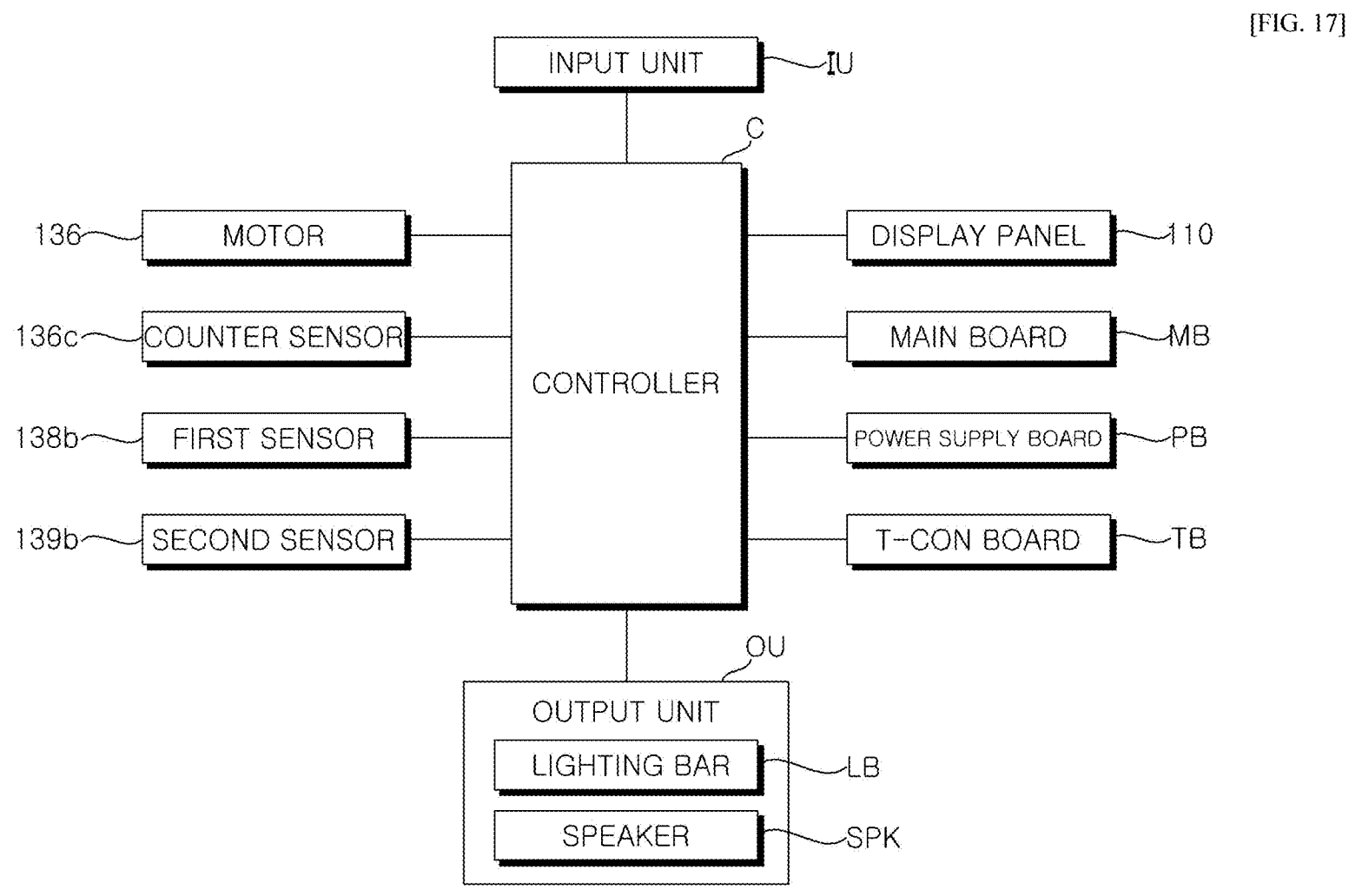

Referring to FIG. 17, a controller C of the display device may control operation of the display device. The controller C may be electrically connected to components of the display device.

The display panel 110, a main board MB, a power supply board PB, and a Timing Controller board (T-CON board) TB may be electrically connected to the controller C. The main board MB may control the display device. The controller C may be implemented as the main board MB or may be a superordinate control unit that controls the main board MB and the like. The power supply board PB may supply power to each component of the display device. The T-CON board TB may provide a video signal to the display panel 110.

The motor 136, the counter sensor 136*c*, the first sensor 138*b*, and the second sensor 139*b* may be electrically connected to the controller C. The controller C may control the operation of the motor 136, i.e. the amount of rotation (rotation angle), and the direction and speed of rotation thereof. The motor 136 may be a step motor. The controller C may control the operation of the motor 136 to adjust the curvature of the display panel 110 in a stepwise manner. The controller C may obtain information detected by the counter sensor 136*c*, the first sensor 138*b*, and the second sensor 139*b*.

An input unit IU may be electrically connected to the controller C. A user may input a signal to the controller C through the input unit IU. For example, the input unit IU may be a remote controller having buttons operated by the user. In another example, the input unit IU may be a microphone recognizing a user's speech. In yet another example, the input unit IU may be an application installed on a user's terminal (smartphone) and controlling the display device by interacting with the user.

An output unit OU may be electrically connected to the controller C. A user may recognize a state of the display device based on information output by the output unit OU. For example, the output unit OU may be a lighting bar LB of the display device which will be described later, and the controller C may provide information to a user using light of the light bar LB. In another example, the output unit OU may be a speaker SPK of the display device which will be described later, and the controller C may provide information to a user using sound of the speaker SPK. In yet another example, the output unit OU may be the display panel 110, and the controller C may provide information to a user through the display panel 110. Alternatively, the output unit OU may be an application installed on a user's terminal (smartphone), and the controller C may provide information to a user using a user interface (UI), a notification message, and the like of the application.

Referring to FIG. 18, a stand 200 may be disposed at the rear of the wing 140. The aforesaid rear bracket 130R (see FIG. 14) may be coupled to the front of the stand 200. The stand 200 may support the plate 120 and the like.

For example, the main board MB, the power supply board PB, the T-CON board TB, the lighting bar LB, and the speaker SPK, which are described above with reference to FIG. 17, may be installed in the stand 200.

The lighting bar LB may be disposed on a rear surface of the stand 200. The lighting bar LB may emit light by receiving power from the power supply board PB (see FIG. 17). The controller C (see FIG. 17) may control the operation of the lighting bar LB. The controller C may adjust brightness and/or color of light of the lighting bar LB. The lighting bar LB may include a light emitting diode (LED).

For example, the lighting bar LB may include a plurality of bars 201, 202, 203, 204, and 205.

A first bar 201 may extend horizontally. A left end of the first bar 201 may be spaced apart from the left side of the stand 200, and a right end of the first bar 201 may be spaced apart from the right side of the stand 200. For example, the first bar 201 may have a shape that is symmetric about a vertical line VV' passing through the center of the stand 200. For example, the first bar 201 may be disposed below a horizontal line HH' passing through the center of the stand 200.

In addition, the first bar 201 may be divided into a plurality of first regions 201*a*, 201*b*, 201*c*, 201*d*, and 201*e*. The plurality of first regions 201*a*, 201*b*, 201*c*, 201*d*, and 201*e* may operate independently. For example, the first regions 201*a*, 201*b*, 201*c*, 201*d*, and 201*e* may be five in number. In another example, the first regions 201*a*, 201*b*, 201*c*, 201*d*, and 201*e* may be two to four in number or six or more in number.

A second bar 202 may extend from the left end of the first bar 201 toward a corner at which the left side and the lower side of the stand 200 meet. The second bar 202 may form an obtuse angle with respect to the first bar 201.

In addition, the second bar 202 may be divided into a plurality of second regions 202*a*, 202*b*, and 202*c*. The plurality of second regions 202*a*, 202*b*, and 202*c* may operate independently. For example, the second regions 202*a*, 202*b*, and 202*c* may be three in number. In another example, the second regions may be two in number or four or more in number.

A third bar 203 may extend from the left end of the first bar 201 toward a corner at which the left side and the upper side of the stand 200 meet. The third bar 203 may form an obtuse angle with respect to the first bar 201.

In addition, the third bar 203 may be divided into a plurality of third regions 203*a*, 203*b*, and 203*c*. The plurality of third regions 203*a*, 203*b*, and 203*c* may operate independently. For example, the third regions 203*a*, 203*b*, and 203*c* may be three in number. In another example, the third regions may be two in number or four or more in number.

A fourth bar 204 may extend from the right end of the first bar 201 toward a corner at which the right side and the lower side of the stand 200 meet. The fourth bar 204 may form an obtuse angle with respect to the first bar 201. For example, the fourth bar 204 may be symmetrical to the second bar 202 about the vertical line VV' passing through the center of the stand 200.

In addition, the fourth bar 204 may be divided into a plurality of fourth regions 204*a*, 204*b*, and 204*c*. The plurality of fourth regions 204*a*, 204*b*, and 204*c* may operate independently. For example, the fourth regions 204*a*, 204*b*, and 204*c* may be three in number. In another example, the fourth regions may be two in number or four or more in number.

A fifth bar 205 may extend from the right end of the first bar 201 toward a corner at which the right side and the upper side of the stand 200 meet. The fifth bar 205 may form an obtuse angle with respect to the first bar 201. For example, the fifth bar 205 may be symmetrical to the third bar 203 about the vertical line VV' passing through the center of the stand 200.

In addition, the fifth bar 205 may be divided into a plurality of fifth regions 205a, 205b, and 205c. The plurality of fifth regions 205a, 205b, and 205c may operate independently. For example, the fifth regions 205a, 205b, and 205c may be three in number. In another example, the fifth regions may be two in number or four or more in number.

The length of the third bar 203 and the fifth bar 205 may be greater than the length of the second bar 202 and the fourth bar 204. The length of the first bar 201 may be smaller than the length of the second bar 202 and the fourth bar 204.

Referring to FIGS. 17 and 19, the controller C may receive a bending signal or an unfolding signal for bending or unfolding the display panel 110 from the input unit IU (S10). The controller C may determine whether the bending signal is input in a state in which the curvature of the display panel 110 is a maximum curvature or the unfolding signal is input in a state in which the curvature of the display panel 110 is a minimum curvature (S20).

If the bending signal is input in a state in which the curvature is not a maximum curvature or if the unfolding signal is input in a state in which the curvature is not a minimum curvature (No in S20), the controller C may drive the motor 136 (S31).

For example, in response to the bending signal, the controller C may rotate the rotating shaft 136a (see FIG. 16) of the motor 136 in a first rotation direction. In this case, the slider 134a may move from the front bracket 130F toward the rear bracket 130R (see FIGS. 7 and 9), and the display panel 110 may be gradually bent.

For example, in response to the unfolding signal, the controller C may rotate the rotating shaft 136a (see FIG. 16) of the motor 136 in a second rotation direction opposite to the first rotation direction. In this case, the slider 134a may move from the rear bracket 130R toward the front bracket 130F (see FIGS. 7 and 9), and the display panel 110 may be gradually unfolded.

The controller C may count the amount of rotation of the motor 136 by using the counter sensor 136c.

For example, when the indicator 136n rotates in the first rotation direction, the counter sensor 136c may detect the holes of the indicator 136b passing between the light emitter and the light receiver of the counter sensor 136c. Based on information obtained from the counter sensor 136c, the controller C may count up the number of holes detected by the counter sensor 136c. That is, as the number of holes detected by the counter sensor 136c increases, a value counted by the controller C may increase.

For example, when the indicator 136b rotates in the second rotation direction, the counter sensor 136c may detect the holes of the indicator 136b passing between the light emitter and the light receiver of the counter sensor 136c. Based on information obtained from the counter sensor 136c, the controller C may count down the number of holes detected by the counter sensor 136c. That is, as the number of holes detected by the counter sensor 136c increases, a value counted by the controller C may decrease.

The controller C may display or notify the curvature, corresponding to the counted value, to a user through the output unit OU (S33). Here, the output unit OU may correspond to at least one of the lighting bar LB, the speaker SPK, the display panel 110, or an application on a user's terminal. For example, a method of displaying the curvature by the output unit OU may be preset in the controller C. For example, the method of displaying the curvature by the output unit OU may be arbitrarily adjusted by a user.

Accordingly, the user may easily recognize the curvature of the display panel 110 through the output unit OU. For example, the user may adjust the curvature of the display panel 110 based on a state of the output unit OU, or may remember the curvature of the display panel 110 based on a state of the output unit OU.

The controller C may determine whether the curvature of the display panel 110 reaches a minimum curvature or a maximum curvature (S40). If the curvature of the display panel 110 does not reach the minimum curvature or the maximum curvature (No in S40), the controller C may bend or unfold the display panel 110 while the bending or unfolding signal is input. If the curvature of the display panel 110 reaches the minimum curvature or the maximum curvature (Yes in S40), the controller C may stop driving the motor 136 even if the bending or unfolding signal is input (S51).

Referring to FIGS. 19 and 20, the controller C may determine whether the display panel 110 has a maximum or minimum curvature by using the counter sensor 136c.

Upon detecting that the unfolding signal is input in S10 (S21), the controller C may determine whether an existing count value is a minimum value (S22). For example, the minimum value may be "zero (0)." If the existing count value is the minimum value (Yes in S22), the controller C may determine that the unfolding signal is input in a state in which the curvature of the display panel 110 is a minimum (S23). In this case, the controller C does not drive the motor and the like even if the unfolding signal is input. If the existing count value is not the minimum value (No in S22), the controller C may determine that the unfolding signal is input in a state in which the curvature of the display panel 110 is not a minimum (S24), and may perform the above operation S31.

Upon detecting that the bending signal is input in S10 (S25), the controller C may determine whether the existing count value is a maximum value (S26). If the existing count value is the maximum value (Yes in S26), the controller C may determine that the bending signal is input in a state in which the curvature of the display panel 110 is a maximum (S27). In this case, the controller C does not drive the motor and the like even if the bending signal is input. If the existing count value is not the maximum value (No in S26), the controller C may determine that the bending signal is input in a state in which the curvature of the display panel 110 is not a maximum (S28), and may perform the above operation S31.

Referring to FIGS. 19 and 21, the controller C may determine in S20' whether the display panel 110 has a maximum or minimum curvature by using the first sensor 138b and the second sensor 139b.

Upon detecting that the unfolding signal is input in S10 (S21), the controller C may determine whether the first sensor 138b detects the pin indicator 138a (S22', see FIG. 16). If the first sensor 138b detects the pin indicator 138a (Yes in S22'), the controller C may determine that the unfolding signal is input in a state in which the curvature of the display panel 110 is a minimum (S23'). In this case, the controller C does not drive the motor and the like even if the unfolding signal is input. If the first sensor 138b does not detect the pin indicator 138a (No in S22'), the controller C may determine that the unfolding signal is input in a state in which the curvature of the display panel 110 is not a minimum (S24'), and may perform the above operation S31.

Upon detecting that the bending signal is input in S10 (S25), the controller C may determine whether the second sensor 139*b* detects the pin indicator 138*a* (S26', see FIG. 16). If the second sensor 139*b* detects the pin indicator 138*a* (Yes in S26'), the controller C may determine that the bending signal is input in a state in which the curvature of the display panel 110 is a maximum (S27'). In this case, the controller C does not drive the motor and the like even if the bending signal is input. If the second sensor 139*b* does not detect the pin indicator 138*a* (No in S26'), the controller C may determine that the bending signal is input in a state in which the curvature of the display panel 110 is not a maximum (S28'), and may perform the above operation S31.

Meanwhile, the controller C may determine, in S20', whether the display panel 110 has a maximum or minimum curvature by using the first and second sensors 138*b* and 139*b* along with the counter sensor 136*c* described above with reference to FIG. 20. Alternatively, the controller C may determine, in S20', a state in which the curvature of the display panel 110 is a minimum by using the first sensor 138*b* (or the first sensor 138*b* and the counter sensor 136*c*) and a state in which the curvature of the display panel 110 is a maximum by using the counter sensor 136*c*. Alternatively, the controller C may determine, in S20', a state in which the curvature of the display panel 110 is a minimum by using the counter sensor 136*c* and a state in which the curvature of the display panel 110 is a maximum by using the second sensor 139*b* (or the second sensor 139*b* and the counter sensor 136*c*).

Figure 22:
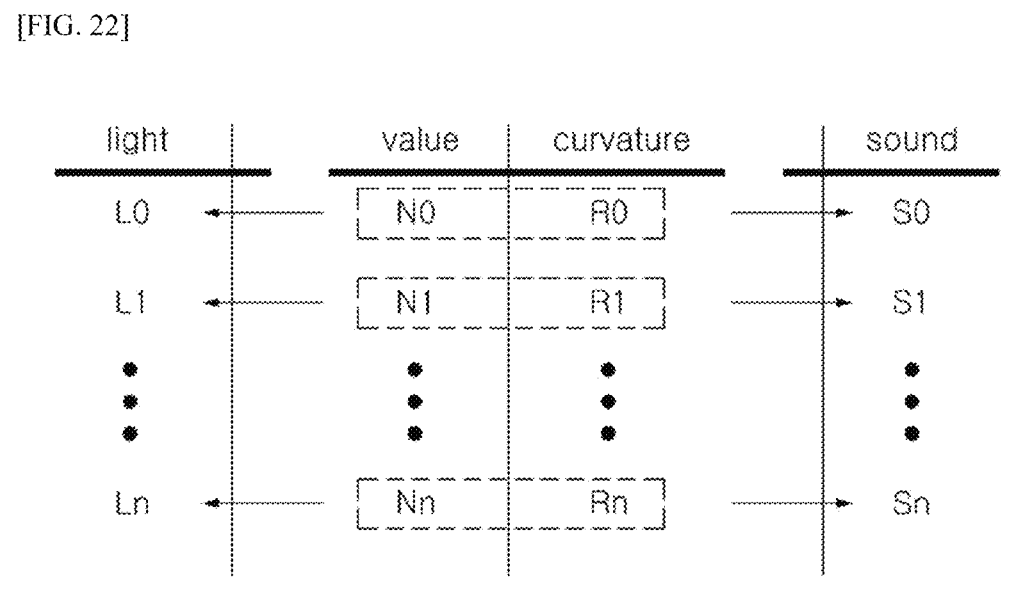

Referring to FIGS. 19 and 22, a value counted by the controller C in S32 may correspond to the curvature of the display panel 110. For example, the counted value may be a specific value, and may correspond to the specific curvature. In another example, the counted value may be in a specific range, and may correspond to a specific curvature range.

The counted value may be one of a plurality of values N0, N1, . . . , and Nn. The curvature of the display panel 110, which corresponds to the counted value, may be one of a plurality of curvatures R0, R1, . . . , and Rn. If the counted value is a minimum value N0, the display panel 110 may be flat. If the counted value is a maximum value Nn, the display panel 110 may be bent to the maximum.

For example, the lighting bar LB may emit light corresponding to the curvature of the display panel 110 in S33. The light emitted by the lighting bar LB may be light of any one of a plurality of types L0, L1, . . . and Ln. The plurality of types L0, L1, . . . and Ln may be different in terms of presence of light, light emitting region, size of the region, brightness of the region, color of the region, blinking of the region, blinking interval of the region, and the like.

For example, the speaker SPK may output sound corresponding to the curvature of the display panel 110 in S33. The sound output by the speaker SPK may be sound of any one of a plurality of types S0, S1, . . . , and Sn. The plurality of types S0, S1, . . . , and Sn may be different in terms of presence of sound, type of sound, sound level (dB), and the like.

Referring to FIGS. 22 and 23, the curvature of the display panel 110 may be visually displayed using the lighting bar LB.

Referring to (a) of FIG. 23, the curvature of the display panel 110 may be a minimum curvature R0. In this case, all the first bar 201, the second bar 202, the third bar 203, the fourth bar 204, and the fifth bar 205 may not emit light.

Referring to (b) of FIG. 23, the curvature of the display panel 110 may be a first curvature R1 greater than the minimum curvature R0. In this case, a 1-1 region 201*a* and a 1-5 region 201*e* of the first bar 201 may emit light. Further, a 2-1 region 202*a* of the second bar 202, a 3-1 region 203*a* of the third bar 203, a 4-1 region 204*a* of the fourth bar 204, a 5-1 region 205*a* of the fifth bar 205 may emit light.

Referring to (c) of FIG. 23, the curvature of the display panel 110 may be a second curvature greater than the first curvature R1. In this case, the 1-1 region 201*a*, a 1-2 region 201*b*, a 1-4 region 201*d*, and the 1-5 region 201*e* of the first bar 201 may emit light. Further, the 2-1 region 202*a* and a 2-2 region 202*b* of the second bar 202 may emit light, and the 3-1 region 203*a* and a 3-2 region of the third bar 203 may emit light. In addition, the 4-1 region 204*a* and a 4-2 region 204*b* of the fourth bar 204 may emit light, and the 5-1 region 205*a* and a 5-2 region 205*b* of the fifth bar 205 may emit light.

Referring to (d) of FIG. 23, the curvature of the display panel 110 may be a maximum curvature Rn. In this case, all the first bar 201, the second bar 202, the third bar 203, the fourth bar 204, and the fifth bar 205 may emit light.

Accordingly, a user may easily recognize the curvature of the display panel 110 through the lighting bar LB. For example, a user may adjust the curvature of the display panel 110 while seeing the lighting bar LB, or may remember the curvature of the display panel 110 based on the state of the lighting bar LB. Meanwhile, the lighting effect of the lighting bar LB may be provided differently from the above by using the brightness and color of light, presence of blinking, etc., to display the curvature of the display panel 110.

Referring to FIGS. 19 and 24, the controller C may determine whether the curvature of the display panel 110 reaches a maximum or minimum curvature by using the counter sensor 136*c* in S40.

The controller C may determine whether the counted value is a minimum value (S41). For example, the minimum value may be "zero (0)." If the counted value is the minimum value (Yes in S41), the controller C may determine that the display panel 110 reaches the minimum curvature (S42). In this case, the controller C may stop driving the motor 136 (S51).

If the counted value is not the minimum value (No in S41), the controller C may determine whether the counted value is a maximum value (S44). If the counted value is the maximum value (Yes in S43), the controller C may determine that the display panel 110 reaches the maximum curvature (S44). In this case, the controller C may stop driving the motor 136 (S51).

If the counted value is not the maximum value (No in S43), the controller C may determine that the display panel 110 does not reach the minimum curvature and the maximum curvature (S45), and may perform the above operation S31.

Referring to FIGS. 19 and 25, the controller C may determine in S40' whether the display panel 110 reaches a maximum or minimum curvature by using the first sensor 138*b* and the second sensor 139*b*.

The controller C may determine whether the first sensor 138*b* detects the pin indicator 138*a* (S41', see FIG. 16). If the first sensor 138*b* detects the pin indicator 138*a* (Yes in S41'), the controller C may determine that the display panel 110 reaches the minimum curvature (S42'). In this case, the controller C may stop driving the motor 136 (S51).

If the first sensor 138*b* does not detect the pin indicator 138*a* (No in S41'), the controller C may determine whether the second sensor 139*b* detects the pin indicator 138*a* (S43', see FIG. 16). If the second sensor 139*b* does not detect the pin indicator 138*a* (Yes in S43'), the controller C may determine that the display panel 110 reaches the maximum curvature (S44'). In this case, the controller C may stop driving the motor 136 (S51).

If the second sensor 139b does not detect the pin indicator 138a (No in S43'), the controller C may determine that the display panel 110 does not reach the minimum curvature and the maximum curvature (S45'), and may perform the above operation S31.

Meanwhile, the controller C may determine in S40' whether the display panel 110 reaches the maximum or minimum curvature by using the first and second sensors 138b and 139b along with the counter sensor 136c described above with reference to FIG. 24. Alternatively, the controller C may determine in S40' whether the display panel 110 reaches the minimum curvature by using the first sensor 138b (or the first sensor 138b and the counter sensor 136c), and may determine whether the display panel 110 reaches the maximum curvature by using the counter sensor 136c. Alternatively, the controller C may determine in S40' whether the display panel 110 reaches the minimum curvature by using the counter sensor 136c and whether the display panel 110 reaches the maximum curvature by using the second sensor 139b (or the second sensor 139b and the counter sensor 136c).

Referring to FIGS. 17 and 26, the controller C may receive a specific bending signal or a specific unfolding signal for bending or unfolding the display panel 110 from the input unit IU (S60). The specific bending signal or the specific unfolding signal may be signals for bending or unfolding the display panel 110 with a specific curvature.

The controller C may determine whether the specific bending signal or the specific unfolding signal is input in a state in which the curvature of the display panel 110 is a specific curvature (S70). If the specific bending signal or the specific unfolding signal is input in a state in which the curvature of the display panel 110 is not the specific curvature (No in S70), the controller C may drive the motor 136 (S81). The description of operation S31, described above with reference to FIG. 19, may also be applied to S81.

The controller C may count the amount of rotation of the motor 136 by using the counter sensor 136c (S82). The description of operation S32, described above with reference to FIG. 19, may also be applied to S82.

The controller C may display or notify a curvature, corresponding to the counted value, to a user through the output unit OU (S33). The description of operation S33, described above with reference to FIG. 19, may also be applied to S83.

The controller C may determine whether the counted value is equal to a set value (S90). The set value may be a value to be counted when the display panel 110 is bent or unfolded with a specific curvature.

If the counted value is different from the set value (No in S90), the controller C may return to S81. For example, if the value counted in response to the specific bending signal is smaller than the set value, the controller C may return to S81 to count up. For example, if the value counted in response to the specific unfolding signal is greater than the set value, the controller C may return to S81 to count down.

If the counted value is equal to the set value (Yes in S90), the controller C may stop driving the motor (S91).

Referring to FIGS. 26 and 27, the controller C may determine whether the display panel 110 has a specific curvature by using the counter sensor 136c in S70.

Upon detecting that the specific unfolding signal is input in S60 (S71), the controller C may determine whether an existing count value is a set value (S72). The set value may be a value to be counted when the display panel 110 is unfolded with a specific curvature. If the existing count value is the set value (Yes in S72), the controller C may determine that the specific unfolding signal is input in a state in which the curvature of the display panel 110 is a specific curvature (S73). In this case, the controller C does not drive the motor and the like even if the specific unfolding signal is input. If the existing count value is not the set value (No in S72), the controller C may determine that the specific unfolding signal is input in a state in which the curvature of the display panel 110 is not the specific curvature (S74) and may perform the above operation S81.

Upon detecting that the specific bending signal is input in S60 (S75), the controller C may determine whether the existing count value is the set value (S76). The set value may be a value to be counted when the display panel 110 is bent with a specific curvature. If the existing count value is the set value (Yes in S76), the controller C may determine that the specific bending signal is input in a state in which the curvature of the display panel 110 is the specific curvature (S77). In this case, the controller C does not drive the motor and the like even if the specific bending signal is input. If the existing count value is not the set value (No in S76), the controller C may determine that the specific bending signal is input in a state in which the curvature of the display panel 110 is not the specific curvature (S78) and may perform the above operation S81.

Referring to FIGS. 26 and 28, the controller C may determine in S70' whether the display panel 110 has a specific curvature by using the first sensor 138b and the second sensor 139b.

Upon detecting that a specific unfolding signal, corresponding to a minimum curvature, is input in S60 (S71'), the controller C may determine whether the first sensor 138b detects the pin indicator 138a (S72'). If the first sensor 138b detects the pin indicator 138a (Yes in S72'), the controller C may determine that the specific unfolding signal is input in a state in which the curvature of the display panel 110 is a specific curvature corresponding to the minimum curvature (S73'). In this case, the controller C does not drive the motor and the like even if the specific unfolding signal is input. If the first sensor 138b does not detect the pin indicator 138a (No in S72'), the controller C may determine that the specific unfolding signal is input in a state in which the curvature of the display panel 110 is not the specific curvature corresponding to the minimum curvature (S74') and may perform the above operation S81.

Upon detecting that the specific bending signal corresponding to a maximum curvature is input in S60 (S75'), the controller C may determine whether the second sensor 139b detects the pin indicator 138a (S76'). If the second sensor 139b detects the pin indicator 138a (Yes in S76'), the controller C may determine that the specific bending signal is input in a state in which the curvature of the display panel 110 is the specific curvature corresponding to the maximum curvature (S77'). In this case, the controller C does not drive the motor and the like even if the specific bending signal is input. If the second sensor 139b does not detect the pin indicator 138a (No in S76'), the controller C may determine that the specific bending signal is input in a state in which the curvature of the display panel 110 is not the specific curvature corresponding to the maximum curvature (S78') and may perform the above operation S81.

Meanwhile, the controller C may determine, in S70', a state in which the curvature of the display panel 110 is the specific curvature corresponding to the maximum or minimum curvature by using the first and second sensors 138b and 139b along with the counter sensor 136c described above with reference to FIG. 27. Alternatively, the controller C may determine, in S70', a state in which the curvature of the display panel 110 is the specific curvature corresponding to the minimum curvature by using the first sensor 138b (or the first sensor 138b and the counter sensor 136c) and a state in which the curvature of the display panel 110 is the specific curvature corresponding to the maximum curvature by using the counter sensor 136c. Alternatively, the controller C may determine, in S70', a state in which the curvature of the display panel 110 is the specific curvature corresponding to the minimum curvature by using the counter sensor 136c and a state in which the curvature of the display panel 110 is the specific curvature corresponding to the maximum curvature by using the second sensor 139b (or the second sensor 139b and the counter sensor 136c).

Referring to FIGS. 17 and 29, if power of the display device or the display panel 110 is turned off (S100), the controller C may determine whether the display panel 110 has a minimum curvature (S110). The controller C may determine in S110 whether the display panel 110 has a minimum curvature by using the counter sensor 136c and/or the first sensor 138b. Determining whether the display panel 110 has the minimum curvature, which is described above with reference to FIGS. 20 and 21 and the like, may also be applied to operation S110.

If the curvature of the display panel 110 is not a minimum (No in S110), the controller C may drive the motor 136 (S121). The controller C may rotate the rotating shaft 136a (see FIG. 16) of the motor 136 in the second rotation direction. In this case, the slider 134a may move from the rear bracket 130R toward the front bracket 130F (see FIGS. 7 and 9), and the display panel 110 may be gradually unfolded.

The controller C may count the amount of rotation of the motor 136 by using the counter sensor 136c (S122). When the indicator 136b (see FIG. 16) rotates in the second rotation direction, the counter sensor 136c may detect the holes of the indicator 136b passing between the light emitter and the light receiver of the counter sensor 136c. Based on information obtained from the counter sensor 136c, the controller C may count down the number of holes detected by the counter sensor 136c. That is, as the number of holes detected by the counter sensor 136c increases, a value counted by the controller C may decrease.

The controller C may display or notify the curvature, corresponding to the counted value, to a user through the output unit OU (S123). Here, the output unit OU may correspond to at least one of the lighting bar LB, the speaker SPK, the display panel 110 or an application on a user's terminal. Accordingly, a user may easily recognize the curvature of the display panel 110 through the output unit OU. Meanwhile, operation S123 may also be omitted.

The controller C may determine whether the curvature of the display panel 110 reaches the minimum curvature (S130). The controller C may determine in S130 whether the display panel 110 has the minimum curvature by using the counter sensor 136c and/or the second sensor 139b. Determining whether the display panel 110 has the minimum curvature, which is described above with reference to FIGS. 24 and 25 and the like, may also be applied to operation S130.

If the curvature of the display panel 110 does not reach the minimum curvature (No in S130), the controller C may return to S121. If the curvature of the display panel 110 reaches the minimum curvature (Yes in S130), the controller C may stop driving the motor 136 (S131).

Accordingly, if power of the display device or the display panel 110 is turned off (S100), the display panel 110 may automatically return to the minimum curvature, i.e., a flat state. In this case, a count value corresponding to the curvature of the display panel 110 may be set to an initial value (e.g., minimum value). In other words, it may not be required to provide a memory and power therefor, the memory for storing a count value corresponding to the curvature of the display panel 110 at a time when power of the display device or the display panel 110 is turned off.

Meanwhile, a rotation speed of the motor 136 driven in S100 may be slower than a rotation speed of the motor 136 driven in S10 (see FIG. 19) or S60 (see FIG. 26).

Meanwhile, even when the power of the display device or the display panel 110 is turned off, the curvature of the display panel 110 may remain the same according to a user's setting and the like. In this case, it may be required to provide a memory and power therefor, the memory for storing a count value corresponding to the curvature of the display panel 110 at a time when power of the display device or the display panel 110 is turned off.

Referring to FIGS. 17 and 30, if power of the display device or the display panel 110 is turned on (S200), the controller C may determine whether the display panel 110 has a minimum curvature (S210). The controller C may determine in S210 whether the display panel 110 has the minimum curvature by using the counter sensor 136c and/or the first sensor 138b. Determining whether the display panel 110 has the minimum curvature, which is described above with reference to FIGS. 20 and 21, and the like may also be applied to operation S210.

If the curvature of the display panel 110 is not a minimum (No in S210), the controller C may drive the motor 136 (S221). The controller C may rotate the rotating shaft 136a (see FIG. 16) of the motor 136 in the second rotation direction. In this case, the slider 134a may move from the rear bracket 130R toward the front bracket 130F (see FIGS. 7 and 9), and the display panel 110 may be gradually unfolded.

The controller C may count the amount of rotation of the motor 136 by using the counter sensor 136c (S222). When the indicator 136b (see FIG. 16) rotates in the second rotation direction, the counter sensor 136c may detect the holes of the indicator 136b passing between the light emitter and the light receiver of the counter sensor 136c. Based on information obtained from the counter sensor 136c, the controller C may count down the number of holes detected by the counter sensor 136c. That is, as the number of holes detected by the counter sensor 136c increases, a value counted by the controller C may decrease.

The controller C may display or notify the curvature, corresponding to the counted value, to a user through the output unit OU (S223). Here, the output unit OU may correspond to at least one of the lighting bar LB, the speaker SPK, the display panel 110, or an application on a user's terminal. Accordingly, a user may easily recognize the curvature of the display panel 110 through the output unit OU. Meanwhile, operation S223 may also be omitted.

The controller C may determine whether the curvature of the display panel 110 reaches the minimum curvature (S230). The controller C may determine in S230 whether the curvature of the display panel 110 is the minimum curvature by using the counter sensor 136c and/or the second sensor 139b. Determining whether the display panel 110 has the minimum curvature, which is described above with reference to FIGS. 24 and 25 and the like, may also be applied to operation S230.

If the curvature of the display panel 110 does not reach the minimum curvature (No in S230), the controller C may return to S221. If the curvature of the display panel 110 reaches the minimum curvature (Yes in S230), the controller C may stop driving the motor 136 (S231).

Accordingly, if power of the display device or the display panel 110 is turned on (S100), the display panel 110 may automatically return to the minimum curvature, i.e., a flat state. In this case, a count value corresponding to the curvature of the display panel 110 may be set to an initial value (e.g., minimum value).

Meanwhile, a rotation speed of the motor 136 driven in S200 may be slower than a rotation speed of the motor 136 driven in S10 (see FIG. 19) or S60 (see FIG. 26).

Meanwhile, even when the power of the display device or the display panel 110 is turned on, the curvature of the display panel 110 may remain the same according to a user's setting and the like.

Referring to FIGS. 30 and 31, when the display panel 110 has the minimum curvature (Yes in S210) or the display panel 110 is changed to the minimum curvature such that driving of the motor is stopped (S231), the controller C may display or notify that the display panel 110 is in a bendable state to a user (S240).

For example, the controller C may display that the display panel 110 is in a bendable state in S240 by blinking the lighting bar LB. The blinking may continue for a predetermined period of time. The blinking may be implemented in a pattern in which (a), (b), (c), and (d) are sequentially repeated. Meanwhile, the lighting effect of the lighting bar LB may be provided differently from the above by using the brightness and color of light, presence of blinking, blinking patterns different from the above example, etc., to display that the display panel 110 is in a bendable state.

In another example, the controller C may display that the display panel 110 is in a bendable state in S240 by using at least one of the light bar LB, the speaker SPK, the display panel 110, or an application on a user's terminal.

Referring to FIGS. 1 to 31, a display device according to one aspect of the present disclosure may include: a flexible display panel; a flexible plate which is positioned behind the display panel and to which the display panel is coupled; a driving module positioned behind the plate and coupled to the plate, the driving module including a slider that performs a linear reciprocating motion and a motor providing power to the slider; a wing positioned behind the plate and having one end coupled to the slider and the other end coupled to the plate, the wing including a pivot shaft disposed adjacent to the one end; a sensor detecting at least one of rotation of the motor or a position of the slider; and a controller controlling operation of the motor based on information obtained from the sensor.

When a curvature of the display panel is a minimum curvature or a maximum curvature, the controller may stop operation of the motor.

The driving module may include: a front bracket fixed to a rear surface of the plate; a rear bracket opposite to the front bracket with respect to the slider; and a pin indicator fixed to the slider, wherein the sensor may include a first sensor adjacent to the front bracket and detecting approach of the pin indicator, wherein when the first sensor detects the pin indicator, the controller may determine that the curvature of the display panel is the minimum curvature.

The driving module may include: a front bracket positioned at a front of the slider; a rear bracket positioned at a rear of the slider; and a pin indicator fixed to the slider, wherein the sensor may include a second sensor adjacent to the rear bracket and detecting approach of the pin indicator, wherein when the second sensor detects the pin indicator, the controller may determine that the curvature of the display panel is the maximum curvature.

The driving module may include an indicator fixed to a rotating shaft of the motor, wherein the sensor may include a counter sensor adjacent to the indicator and detecting rotation of the indicator.

The indicator may have a circular plate shape and may include a plurality of holes which are spaced apart from each other in a circumferential direction of the indicator, wherein the counter sensor may include: a light emitter; and a light receiver facing the light emitter and spaced apart from the light emitter, wherein the indicator may rotate while passing between the light emitter and the light receiver.

The counter sensor may detect a number of holes of the indicator, wherein when the motor rotates in a first rotation direction, the display panel may be bent, and when the motor rotates in a second rotation direction opposite to the first rotation direction, the display panel may be unfolded, wherein the controller may count up the number of holes detected by the counter sensor during a bending motion of the display panel, and may count down the number of holes detected by the counter sensor during an unfolding motion of the display panel.

When a count value, determined based on the number of holes detected by the counter sensor, is a minimum value, the controller may determine that the display panel has the minimum curvature, and when the count value is a maximum value, the controller may determine that the display panel has the maximum curvature.

The display device may further include an output unit electrically connected to the controller, wherein the controller may calculate an amount of rotation of the indicator based on information obtained from the counter sensor, and may output the curvature of the display panel, corresponding to the amount of rotation, through the output unit.

The controller may calculate the amount of rotation of the indicator based on a position of the indicator when the display panel has the minimum curvature.

When power of the display device or the display panel being switched from ON to OFF or from OFF to ON, the controller may control the operation of the motor to change the display panel to the minimum curvature.

The output unit may be at least one of the display panel, a lighting bar, a speaker, or an application on a user's terminal.

The display device may further include a stand to which the plate is coupled and supporting the plate, wherein the output unit may include a lighting bar positioned on a rear surface of the stand, and emitting light that varies depending on the curvature of the display panel.

The lighting bar may include a plurality of bars, wherein each of the plurality of bars is divided into a plurality of regions that operate independently of each other.

The display device may further include a wing bracket which is positioned behind the plate, which is coupled to the plate, and to which the pivot shaft is rotatably coupled, wherein: the motor may be a step motor; and the driving module may further include: a bracket fixed to the plate; a lead screw extending in a direction of the linear reciprocating motion of the slider, gear-connected to the motor, and rotatably coupled to the bracket; and a guide shaft parallel to the lead screw and fixed to the bracket, wherein the slider may have one side screw-coupled to the lead screw and the other side into which the guide shaft is inserted.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

The foregoing embodiments are merely examples and are not to be considered as limiting the present disclosure. The scope of the present disclosure should be determined by rational interpretation of the appended claims, and all modifications within the equivalents of the disclosure are intended to be included within the scope of the present disclosure.

The invention claimed is:

1. A display device comprising:
a flexible display panel;
a flexible plate which is positioned behind the display panel and to which the display panel is coupled;
a driving module positioned behind the plate and coupled to the plate, the driving module including a slider that performs a linear reciprocating motion and a motor providing power to the slider;
a wing positioned behind the plate and having one end coupled to the slider and the other end coupled to the plate, the wing including a pivot shaft disposed adjacent to the one end;
a sensor detecting at least one of rotation of the motor or a position of the slider; and
a controller controlling operation of the motor based on information obtained from the sensor,
wherein the driving module comprises an indicator fixed to a rotating shaft of the motor, and
wherein the sensor comprises a counter sensor adjacent to the indicator and detecting rotation of the indicator.

2. The display device of claim 1, wherein when a curvature of the display panel is a minimum curvature or a maximum curvature, the controller stops operation of the motor.

3. The display device of claim 1, wherein the indicator has a circular plate shape and includes a plurality of holes which are spaced apart from each other in a circumferential direction of the indicator,
wherein the counter sensor comprises:
a light emitter; and
a light receiver facing the light emitter and spaced apart from the light emitter, and
wherein the indicator rotates while passing between the light emitter and the light receiver.

4. The display device of claim 3, wherein the counter sensor detects a number of holes of the indicator,
wherein when the motor rotates in a first rotation direction, the display panel is bent, and when the motor rotates in a second rotation direction opposite to the first rotation direction, the display panel is unfolded, and
wherein the controller counts up the number of holes detected by the counter sensor during a bending motion of the display panel, and counts down the number of holes detected by the counter sensor during an unfolding motion of the display panel.

5. The display device of claim 4, wherein when a count value, determined based on the number of holes detected by the counter sensor, is a minimum value, the controller determines that the display panel has a minimum curvature, and when the count value is a maximum value, the controller determines that the display panel has a maximum curvature.

6. The display device of claim 1, further comprising an output unit electrically connected to the controller,
wherein the controller calculates an amount of rotation of the indicator based on information obtained from the counter sensor, and outputs a curvature of the display panel, corresponding to the amount of rotation, through the output unit.

7. The display device of claim 6, wherein the controller calculates the amount of rotation of the indicator based on a position of the indicator when the display panel has a minimum curvature.

8. The display device of claim 7, wherein when power of the display device or the display panel being switched from ON to OFF or from OFF to ON, the controller controls the operation of the motor to change the display panel to the minimum curvature.

9. The display device of claim 6, wherein the output unit is at least one of the display panel, a lighting bar, a speaker, or an application on a user's terminal.

10. The display device of claim 6, further comprising a stand to which the plate is coupled and supporting the plate,
wherein the output unit comprises a lighting bar positioned on a rear surface of the stand, and emitting light that varies depending on the curvature of the display panel.

11. The display device of claim 10, wherein the lighting bar comprises a plurality of bars, and
wherein each of the plurality of bars is divided into a plurality of regions that operate independently of each other.

12. The display device of claim 1, further comprising a wing bracket which is positioned behind the plate, which is coupled to the plate, and to which the pivot shaft is rotatably coupled,
wherein:
the motor is a step motor; and
the driving module further comprises:
a bracket fixed to the plate;
a lead screw extending in a direction of the linear reciprocating motion of the slider, gear-connected to the motor, and rotatably coupled to the bracket; and
a guide shaft parallel to the lead screw and fixed to the bracket, and
wherein the slider has one side screw-coupled to the lead screw and the other side into which the guide shaft is inserted.

13. A display device comprising:
a flexible display panel;
a flexible plate which is positioned behind the display panel and to which the display panel is coupled;
a driving module positioned behind the plate and coupled to the plate, the driving module including a slider that performs a linear reciprocating motion and a motor providing power to the slider;
a wing positioned behind the plate and having one end coupled to the slider and the other end coupled to the plate, the wing including a pivot shaft disposed adjacent to the one end;
a sensor detecting at least one of rotation of the motor or a position of the slider; and a controller controlling operation of the motor based on information obtained from the sensor, wherein when a curvature of the display panel is a minimum curvature or a maximum curvature, the controller stops operation of the motor, wherein the driving module comprises:

a front bracket fixed to a rear surface of the plate;

a rear bracket opposite to the front bracket with respect to the slider; and a pin indicator fixed to the slider, wherein the sensor comprises a first sensor adjacent to the front bracket and detecting approach of the pin indicator, and wherein when the first sensor detects the pin indicator, the controller determines that the curvature of the display panel is the minimum curvature.

14. A display device comprising:

a flexible display panel;

a flexible plate which is positioned behind the display panel and to which the display panel is coupled;

a driving module positioned behind the plate and coupled to the plate, the driving module including a slider that performs a linear reciprocating motion and a motor providing power to the slider;

a wing positioned behind the plate and having one end coupled to the slider and the other end coupled to the plate, the wing including a pivot shaft disposed adjacent to the one end;

a sensor detecting at least one of rotation of the motor or a position of the slider; and a controller controlling operation of the motor based on information obtained from the sensor, wherein the driving module comprises:

a front bracket positioned at a front of the slider;

a rear bracket positioned at a rear of the slider; and a pin indicator fixed to the slider, wherein the sensor comprises a second sensor adjacent to the rear bracket and detecting approach of the pin indicator, and wherein when the second sensor detects the pin indicator, the controller determines that a curvature of the display panel is a maximum curvature.

\* \* \* \* \*